(12) United States Patent
Uhm

(10) Patent No.: US 12,733,207 B2
(45) Date of Patent: Sep. 8, 2026

(54) SEMICONDUCTOR DEVICES

(71) Applicant: Samsung Electronics Co., Ltd., Suwon-si (KR)

(72) Inventor: Sanghoon Uhm, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 441 days.

(21) Appl. No.: 18/347,770

(22) Filed: Jul. 6, 2023

(65) Prior Publication Data

US 2024/0243205 A1 Jul. 18, 2024

(30) Foreign Application Priority Data

Jan. 12, 2023 (KR) ........................ 10-2023-0004508

(51) Int. Cl.

*H10D 30/67* (2025.01)
*H10B 12/00* (2023.01)
*H10W 20/41* (2026.01)

(52) U.S. Cl.

CPC ....... *H10D 30/6728* (2025.01); *H10B 12/315* (2023.02); *H10B 12/482* (2023.02); *H10D 30/673* (2025.01); *H10D 30/6756* (2025.01); *H10W 20/435* (2026.01); *H10D 30/6736* (2025.01)

(58) Field of Classification Search

CPC ............. H10D 30/6728; H10D 30/673; H10D 30/6756; H10B 12/315; H10B 12/482; H10W 20/435

See application file for complete search history.

(56) References Cited

U.S. PATENT DOCUMENTS

| | | | | |
|---|---|---|---|---|
| 9,831,309 | B2 | 11/2017 | Miyairi | |
| 10,418,381 | B2 | 9/2019 | Yamazaki et al. | |
| 10,923,493 | B2 * | 2/2021 | Fayrushin | H10B 43/27 |
| 11,088,285 | B2 | 8/2021 | Lai et al. | |
| 11,329,133 | B2 | 5/2022 | Lee et al. | |
| 11,569,244 | B2 * | 1/2023 | Doornbos | H10D 62/826 |
| 12,495,538 | B2 * | 12/2025 | Kim | H10B 12/0335 |
| 12,527,027 | B2 * | 1/2026 | Uhm | H10B 12/05 |
| 2018/0197988 | A1 * | 7/2018 | Ratnam | H10B 63/34 |
| 2019/0067475 | A1 * | 2/2019 | Liu | H10D 30/63 |
| 2020/0098932 | A1 * | 3/2020 | Lajoie | H10B 12/33 |
| 2020/0111800 | A1 * | 4/2020 | Ramaswamy | H10B 53/30 |
| 2021/0143284 | A1 * | 5/2021 | Karda | H10D 30/6755 |
| 2022/0130832 | A1 * | 4/2022 | Tsai | H10B 12/312 |
| 2022/0149208 | A1 | 5/2022 | Wang et al. | |
| 2022/0223732 | A1 | 7/2022 | Ryu et al. | |
| 2022/0278227 | A1 | 9/2022 | Huang et al. | |
| 2022/0384525 | A1 * | 12/2022 | Wu | H10B 63/34 |

* cited by examiner

*Primary Examiner* — Eugene Lee

(74) *Attorney, Agent, or Firm* — Wolf, Greenfield & Sacks, P.C.

(57) ABSTRACT

A semiconductor device includes a bit line on a substrate, a gate electrode on the bit line, a gate insulation pattern on a sidewall of the gate electrode, a channel that contacts an upper surface of the bit line and a sidewall of the gate insulation pattern, an oxide semiconductor pattern that contacts an upper sidewall of the channel, and a contact plug that contacts an upper surface of the channel and an upper surface of the oxide semiconductor pattern. The channel includes an amorphous oxide semiconductor material. The oxide semiconductor pattern includes a crystalline oxide semiconductor material.

20 Claims, 29 Drawing Sheets

SEMICONDUCTOR DEVICES

CROSS-REFERENCE TO RELATED APPLICATION

This application claims priority under 35 U.S.C. § 119 to Korean Patent Application No. 10-2023-0004508 filed on Jan. 12, 2023 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a memory device including a vertical channel.

BACKGROUND

To improve an integration degree of a semiconductor device, a memory device including a vertical channel transistor has been developed, and recently, an oxide semiconductor material has been used in a channel of the vertical channel transistor. There is a need for a method of reducing contact resistance between a channel including an oxide semiconductor material and a contact plug including a metal and applying an electrical signal to the channel.

SUMMARY

Example embodiments provide a semiconductor device having improved characteristics.

According to example embodiments, a semiconductor device may include a bit line, a gate electrode, a gate insulation pattern, a channel, an oxide semiconductor pattern and a contact plug. The bit line may be on a substrate. The gate electrode may be on the bit line. The gate insulation pattern may be on a sidewall of the gate electrode. The channel may contact an upper surface of the bit line and a sidewall of the gate insulation pattern, and may include an amorphous oxide semiconductor material. The oxide semiconductor pattern may contact an upper sidewall of the channel, and may include a crystalline oxide semiconductor material. The contact plug may contact a top surface of the channel and an upper surface of the oxide semiconductor pattern.

According to example embodiments, a semiconductor device may include a bit line, a gate electrode, a gate insulation pattern, a channel, an oxide semiconductor pattern and a contact plug. The bit line may be on a substrate. The gate electrode may be on the bit line. The gate insulation pattern may be on a sidewall of the gate electrode. The channel may contact an upper surface of the bit line and a sidewall of the gate insulation pattern. The oxide semiconductor pattern may contact an upper portion of a sidewall of the channel. The contact plug may contact a top surface of the channel and an upper surface of the oxide semiconductor pattern, and may have a sidewall align with a sidewall of the oxide semiconductor pattern in a vertical direction substantially perpendicular to an upper surface of the substrate.

According to example embodiments, a semiconductor device may include bit lines, gate electrodes, a gate insulation pattern, a channel, an oxide semiconductor pattern, a contact plug and a capacitor. Bit lines may be on a substrate, and each of the bit lines may extend in a first direction substantially parallel to an upper surface of the substrate. The bit lines may be spaced apart from each other in a second direction that is substantially parallel to the upper surface of the substrate and intersects the first direction. Each of the gate electrodes may extend in the second direction on the bit lines, and the gate electrodes may be spaced apart from each other in the first direction. The gate insulation pattern may be on a sidewall in the first direction of each of the gate electrodes. The channel may contact an upper surface of each of the bit lines and a sidewall of the gate insulation pattern in the first direction, and may include an amorphous oxide semiconductor material. The oxide semiconductor pattern may contact an upper portion of a sidewall of the channel in the first direction, and may include a crystalline oxide semiconductor material. The contact plug may contact a top surface of the channel and an upper surface of the oxide semiconductor pattern. The capacitor may be on the contact plug.

The semiconductor device in accordance with example embodiments may include the oxide semiconductor pattern contacting the sidewall of the channel between the bit line and the contact plug and a surface of the contact plug, and thus the oxide semiconductor pattern and the channel may collectively function as a channel structure, so that contact resistance between the contact plug and the channel structure may be reduced.

The oxide semiconductor pattern may include a crystalline oxide semiconductor material unlike the channel including an amorphous oxide semiconductor material, and thus a contact resistance between the oxide semiconductor pattern and the contact plug may be lower than a contact resistance between the channel and the contact plug.

Furthermore, the oxide semiconductor pattern may have an increased carrier concentration when compared to the channel, and thus the semiconductor device may have an increased on-current.

BRIEF DESCRIPTION OF THE DRAWINGS

FIGS. 2 and 3 are cross-sectional views illustrating a semiconductor device in accordance with the teachings of the present disclosure.

DETAILED DESCRIPTION

The above and other aspects and features of a semiconductor device and a method of forming the same in accordance with example embodiments will become readily understood from detail descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of the present disclosure.

Hereinafter, in the specification (and not necessarily in the claims), two directions that are substantially perpendicular to each other among horizontal directions, which are substantially parallel to an upper surface of a substrate, may be referred to as first and second directions D1 and D2, respectively, and a vertical direction substantially perpendicular to the upper surface of the substrate may be referred to as a third direction D3. In example embodiments, the first and second directions D1 and D2 may be orthogonal to each other.

Figure 1:
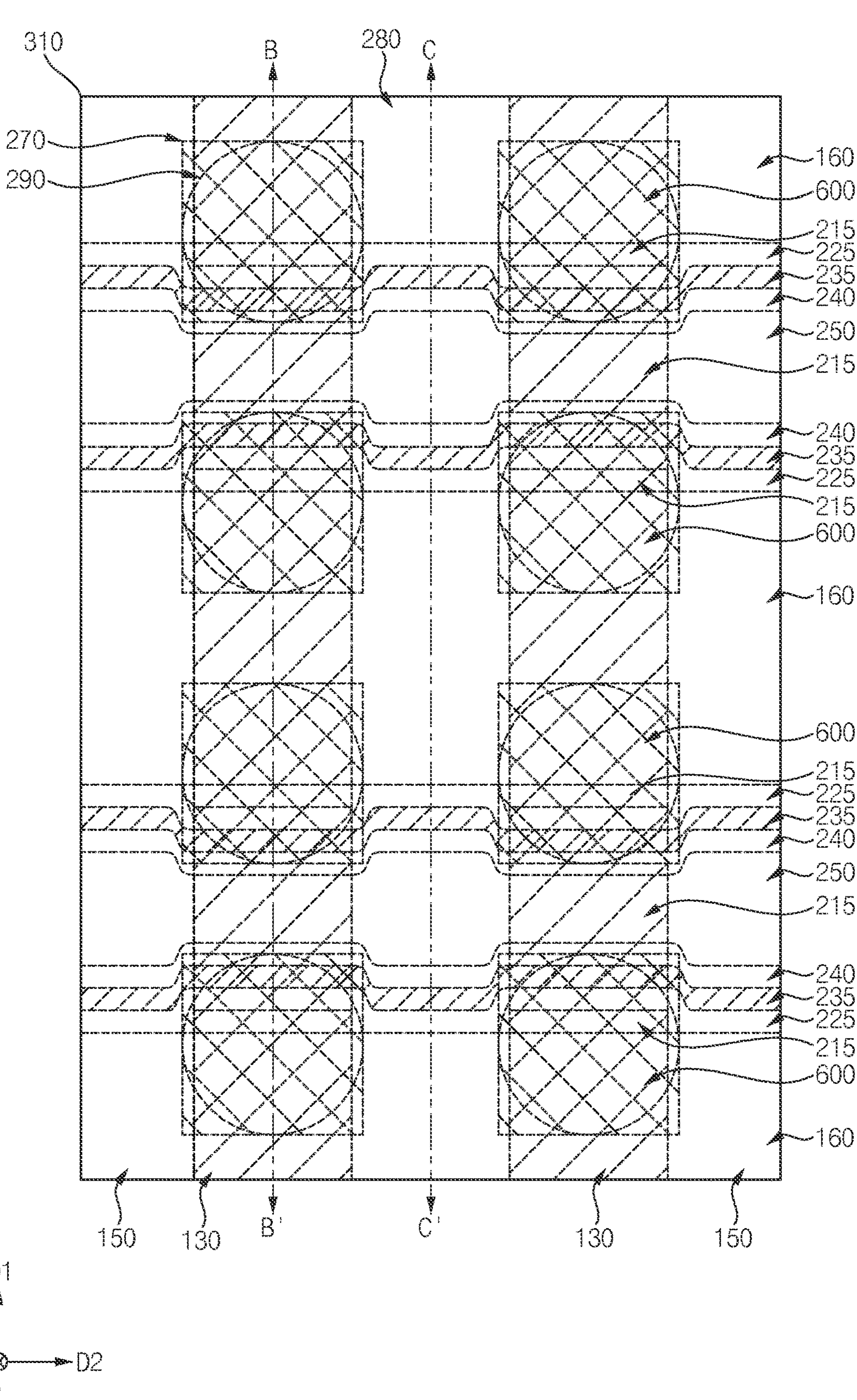
FIG. 1 is a plan view illustrating a semiconductor device in accordance with example embodiments of the present disclosure.
Figure 2:
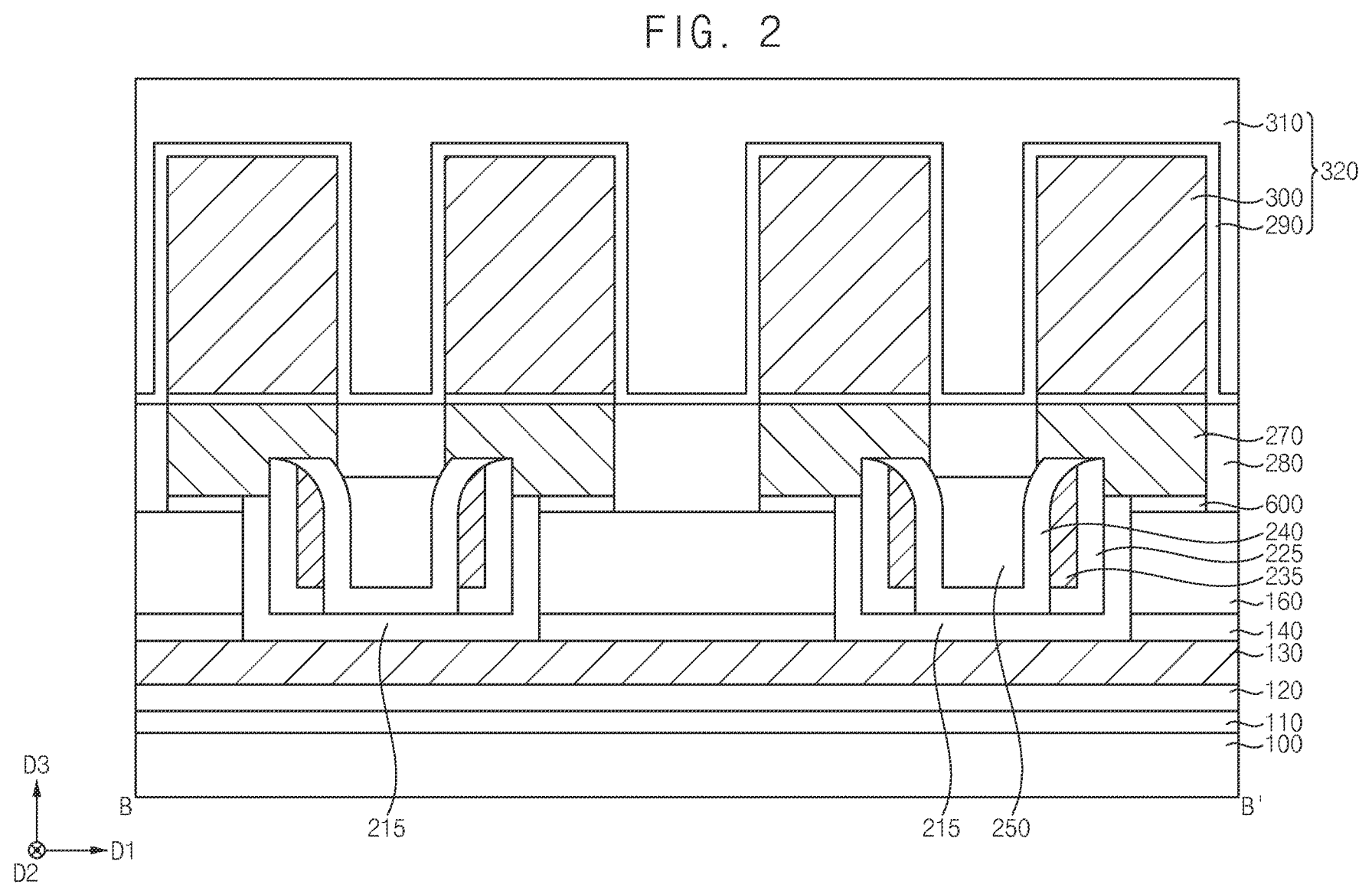
Figure 3:
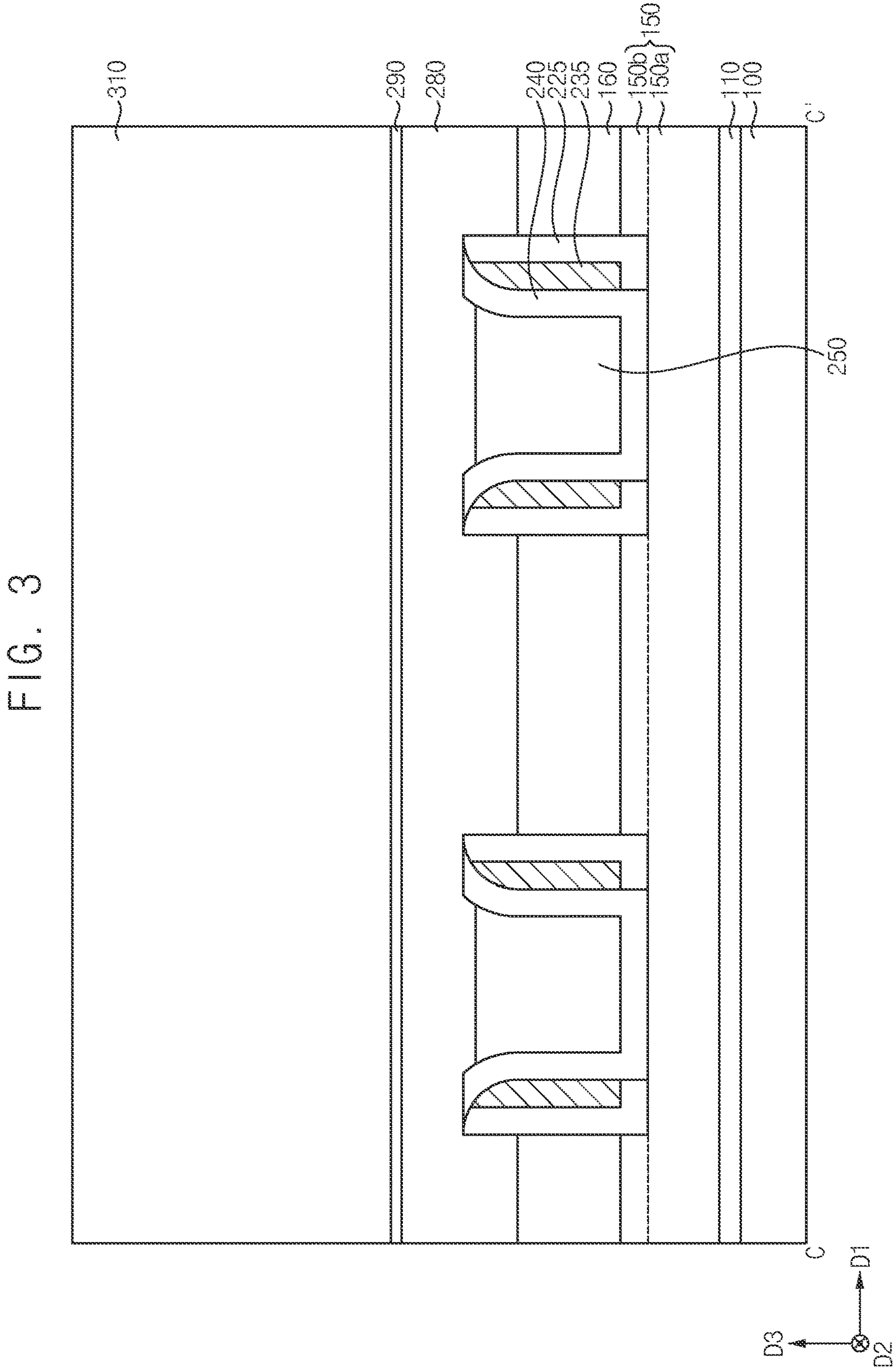

FIGS. 1 to 3 are plan views and cross-sectional views illustrating a semiconductor device in accordance with example embodiments. Specifically, FIG. 2 is a cross-sectional view taken along line B-B' of FIG. 1, and FIG. 3 is a cross-sectional view taken along line C-C' of FIG. 1.

Referring to FIGS. 1 to 3, the semiconductor device may include a bit line structure, a gate electrode 235, a gate insulation pattern 225, a channel 215, an oxide semiconductor pattern 600, a contact plug 270 and a capacitor 320 on a substrate 100.

The semiconductor device may further include a first insulation layer 110, a fourth insulation pattern 240, and first to fourth insulating interlayer patterns 150, 160, 250 and 280.

The substrate 100 may include a semiconductor material, an insulating material, a conductive material, etc.

Referring to FIGS. 1 to 5, the first insulation layer 110 may be on the substrate 100, and the bit line structure may extend in the first direction D1 on the first insulation layer 110.

In example embodiments, the bit line structure may include a second insulation pattern 120, a bit line 130, and a third insulation pattern 140 sequentially stacked on the first insulation layer 110 in the third direction D3. Each of the second insulation pattern 120 and the bit line 130 may extend in the first direction D1, and a plurality of third insulation patterns 140 may be spaced apart from each other in the first direction D1 on the bit line 130.

A plurality of bit line structures may be spaced apart from each other in the second direction D2, and the first insulating interlayer pattern 150 between the bit line structures neighboring in the second direction D2 may extend in the first direction D1 on the first insulation layer 110.

A first portion of the first insulating interlayer pattern 150 adjacent to the third insulation pattern 140 in the second direction D2 may have an upper surface higher than an upper surface of a second portion of the first insulating interlayer pattern 150 adjacent to the channel 215 in the second direction D2 (i.e., a distance of an upper surface of the first portion from an upper surface of the substrate is greater than a distance of an upper surface of the second portion from the upper surface of the substrate). An upper portion of the first portion of the first insulating interlayer pattern 150 may be substantially coplanar with the third insulation pattern 140, and thus the upper surface of the first portion of the first insulating interlayer pattern 150 may be substantially coplanar with an upper surface of the third insulation pattern 140. The upper surface of the second portion of the first insulating interlayer pattern 150 may be substantially coplanar with an upper surface of the bit line 130.

Third insulation patterns 140 are spaced apart from each other in the first direction D1, and thus a plurality of first portions of the first insulating interlayer pattern 150 may also be spaced apart from each other in the first direction D1. Thus, the first and second portions of the first insulating interlayer pattern 150 may be alternately and repeatedly disposed in the first direction D1, and a height of the upper surface of the first insulating interlayer pattern 150 may periodically vary in the first direction D1.

In example embodiments, the first insulating interlayer pattern 150 may include a lower portion 150*a*, which may be formed on the first insulation layer 110 and substantially coplanar with the second insulation pattern 120 and the bit line 130. The first insulating interlayer pattern 150 may also include upper portions 150*b*, which may be formed on the lower portion 150*a* and adjacent to the third insulation patterns 140, respectively, in the second direction D2.

Each of the first insulation layer 110 and the first insulating interlayer pattern 150 may include an oxide, e.g., silicon oxide. The bit line 130 may include a conductive material, e.g., a metal, a metal nitride, or a metal silicide, and the second and third insulation patterns 120 and 140 may include an insulating nitride, e.g., silicon nitride.

The second insulating interlayer pattern 160, which may extend in the second direction D2, may be on the third insulation pattern 140 and the first portion of the first insulating interlayer pattern 150. Hereinafter, the third insulation pattern 140, the upper portion 150*b* of the first portion of the first insulating interlayer pattern 150, and the second insulating interlayer pattern 160 thereon may be referred to as an "insulation structure." In example embodiments, the insulation structure may extend in the second direction D2, and a plurality of insulation structures may be spaced apart from each other in the first direction D1.

The oxide semiconductor pattern 600 may be on the insulation structure. In example embodiments, a plurality of oxide semiconductor patterns 600 may be spaced apart from each other in the second direction D2 on the second insulating interlayer pattern 160 extending in the second direction D2, and each of the oxide semiconductor patterns 600 may overlap the bit line structure in the third direction D3.

The second insulating interlayer pattern 160 may include an oxide, e.g., silicon oxide, and the oxide semiconductor pattern 600 may include a crystalline oxide semiconductor material.

The third insulating interlayer pattern 250 extending in the second direction D2 and the fourth insulation pattern 240 surrounding the third insulating interlayer pattern 250 may be between the insulation structures neighboring in the first direction D1. The channel 215, the gate insulation pattern 225 and the gate electrode 235 may be sequentially stacked in the first direction D1 between the insulation structure and the fourth insulation pattern 240.

The channel 215 may contact the upper surface of the bit line 130 and sidewalls of the insulation structures neighboring in the first direction D1. The channel 215 may also contact sidewalls of the oxide semiconductor patterns 600 on the respective insulation structures.

In example embodiments, a plurality of channels 215 may be spaced apart from each other in the first direction D1 by the insulation structure on each of the bit lines 130. Additionally, a plurality of channels 215 may be spaced apart from each other in the second direction D2 by the gate insulation pattern 225.

In example embodiments, the channel 215 may include a horizontal portion with a lower surface contacting the upper surface of the bit line 130, and a vertical portion on the horizontal portion. The vertical portion may have an outer sidewall contacting a sidewall of the insulation structure and a sidewall of the oxide semiconductor pattern 600. Thus, in example embodiments, a cross-section of the channel 215 in the first direction D1 may have a conical frustum shape (e.g., a cup shape).

In example embodiments, a top surface of the channel 215 may be substantially coplanar with an upper surface of the oxide semiconductor pattern 600.

In example embodiments, the channel 215 may include an amorphous oxide semiconductor material. For example, each of the channel 215 and the oxide semiconductor pattern 600 may include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_2O_d$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO).

However, as mentioned above, the channel 215 may include an amorphous oxide semiconductor material, while the oxide semiconductor pattern 600 may include a crystalline oxide semiconductor material. Accordingly, a carrier concentration of the oxide semiconductor pattern 600 may be greater than a carrier concentration of the channel 215.

The gate insulation pattern 225 may contact an inner sidewall of the vertical portion of the channel 215, the sidewall of the insulation structure, a lower sidewall of the contact plug 270 and a lower sidewall of the fourth insulating interlayer pattern 280. The gate insulation pattern 225 may also contact an upper surface of an edge portion in the first direction D1 of the horizontal portion of the channel 215 and an upper surface of the lower portion 150*a* of the first insulating interlayer pattern 150. Accordingly, in example embodiments, a cross-section of the gate insulation pattern 225 in the first direction D1 may have an "L" shape.

The gate insulation pattern 225 may include a first portion, which may contact the inner sidewall of the vertical portion of the channel 215 and the lower sidewall of the contact plug 270, and a second portion, which may contact the sidewall of the insulation structure and the lower sidewall of the fourth insulating interlayer pattern 280.

In example embodiments, the gate insulation pattern 225 may extend in the second direction D2. However, the gate insulation pattern 225 may not extend in a straight line in the second direction D2, but may extend in a curve in the second direction D2, in a plan view. The first portion and the second portion of the gate insulation pattern 225 may not be aligned with each other in the second direction D2 due to the channel 215. The first and second portions of the gate insulation pattern 225 may be alternately and repeatedly disposed in the second direction D2, and thus the gate insulation pattern 225 may extend in a curve in the second direction D2.

In example embodiments, lower surfaces of the first and second portions of the gate insulation pattern 225 may be at different heights from each other. That is, the first portion of the gate insulation pattern 225 may contact an upper surface of the horizontal portion of the channel 215 on the upper surface of the bit line 130. As such, the lower surface of the first portion of the gate insulation pattern 225 may be substantially coplanar with the upper surface of the horizontal portion of the channel 215 on the upper surface of the bit line 130. Additionally, the second portion of the gate insulation pattern 225 may contact an upper surface of the lower portion 150*a* of the first insulating interlayer pattern 150, and an upper surface thereof may be substantially coplanar with the upper surface of the bit line 130. As such, the lower surface of the second portion of the gate insulation pattern 225 may be substantially coplanar with the upper surface of the bit line 130.

Thus, the lower surface of the first portion of the gate insulation pattern 225 may be higher than the lower surface of the second portion thereof. Accordingly, a height of the lower surface of the gate insulation pattern 225 may vary periodically in the second direction D2.

In example embodiments, a top surface of the gate insulation pattern 225 may be higher than the top surface of the channel 215. The gate insulation pattern 225 may include an oxide, e.g., silicon oxide.

The gate electrode 235 may be on the gate insulation pattern 225, and a sidewall and a lower surface of the gate electrode 235 may be covered by the gate insulation pattern 225. The gate electrode 235 may include a first portion on the first portion of the gate insulation pattern 225 and a second portion on the second portion of the gate insulation pattern 225.

Similar to the gate insulation pattern 225, the gate electrode 235 may also extend in a curve in the second direction D2. The first portion and the second portion of the gate electrode 235 may not be aligned with each other in the second direction D2 due to the gate insulation pattern 225. The first and second portions may be alternately and repeatedly disposed in the second direction D2, and thus the gate insulation pattern 225 may extend in a curve in the second direction D2.

In example embodiments, the lower surfaces of the first and second portions of the gate electrode 235 may be at different heights from each other. The first portion of the gate electrode 235 may be on the first portion of the gate insulation pattern 225, which may be at a relatively higher level, and the second portion of the gate electrode 235 may be disposed on the second portion of the gate insulation pattern 225, which may be at a relatively lower level. Thus, the lower surface of the first portion of the gate electrode 235 may be higher than the lower surface of the second portion of the gate electrode 235. Accordingly, a height of the lower surface of the gate electrode 235 may vary periodically in the second direction D2.

In example embodiments, a top surface of the gate electrode 235 may be lower than the top surface of the gate insulation pattern 225, and may be higher than the top surface of the channel 215. The gate electrode 235 may include a conductive material, e.g., a metal, a metal nitride, or a metal silicide.

The fourth insulation pattern 240 may contact the upper surface of the horizontal portion of the channel 215, the upper surface of the lower portion 150*a* of the first insulating interlayer pattern 150, an inner sidewall and an upper surface of the gate electrode 235, and an inner sidewall and the upper surface of the gate insulation pattern 225. A cross-section in the first direction D1 of the fourth insulation pattern 240 have an “L” shape.

The third insulating interlayer pattern 250 may be on the fourth insulation pattern 240, and a lower surface and a sidewall of the third insulating interlayer pattern 250 may be covered by the fourth insulating interlayer pattern 240. In example embodiments, an upper surface of the third insulating interlayer pattern 250 may be lower than a top surface of the fourth insulation pattern 240.

The third insulating interlayer pattern 250 may include an oxide, e.g., silicon oxide, and the fourth insulation pattern 240 may include an insulating nitride, e.g., silicon nitride.

The contact plug 270 may be on the channel 215. In example embodiments, the contact plug 270 may contact the top surface of the channel 215 and the upper surface of the oxide semiconductor pattern 600, and may further contact portions of the gate insulation pattern 225 and the fourth insulation pattern 240 adjacent to the channel 215. The contact plug 270 may not contact the upper surface of the gate electrode 235 and may be spaced apart from the upper surface of the gate electrode 235 by the fourth insulation pattern 240. In example embodiments, a sidewall of the contact plug 270 in the first direction D1 may be aligned with a sidewall of the oxide semiconductor pattern 600 in the third direction D3.

In example embodiments, a plurality of contact plugs 270 may be spaced apart from each other in the first and second directions D1 and D2, and may be arranged in a lattice pattern or honeycomb pattern in a plan view.

The contact plug 270 may include a conductive material such as a metal, a metal nitride, or a metal silicide.

The fourth insulating interlayer pattern 280 may be on the second and third insulating interlayer patterns 160 and 250, and may cover sidewalls of the contact plug 270 and the oxide semiconductor pattern 600 and an upper sidewall of the gate insulation pattern 225. The fourth insulating interlayer pattern 280 may include, for example, an insulating nitride such as silicon nitride.

The capacitor 320 may include first and second capacitor electrodes 300 and 310, and a dielectric layer 290 therebetween. The first capacitor electrode 300 may be on the contact plug 270. The dielectric layer 290 may be on an upper surface and a sidewall of the first capacitor electrode 300 and an upper surface of the fourth insulating interlayer pattern 280. The second capacitor electrode 310 may be on the dielectric layer 290.

As the contact plugs 270 are spaced apart from each other in the first and second directions D1 and D2, a plurality of first capacitor electrodes 300 may also be spaced apart from each other in the first and second directions D1 and D2.

In example embodiments, the first capacitor electrode 300 may have a shape, e.g., a circle, an ellipse, a polygon, a polygon with rounded corners, etc., in a plan view. The first capacitor electrode 300 may be arranged in a lattice pattern or a honeycomb pattern in a plan view.

In the semiconductor device, current may flow in the third direction D3, that is, in the vertical direction, within the channel 215 between the bit line 130 and the contact plug 270. Thus, the semiconductor device may include a vertical channel transistor (VCT), which may have a vertical channel.

In example embodiments, the oxide semiconductor pattern 600 may be on and contact the sidewall of the channel 215, and the contact plug 270 may contact the upper surface of the oxide semiconductor pattern 600. Accordingly, the oxide semiconductor pattern 600 connected to the channel 215 may also be between the bit line 130 and the contact plug 270 in addition to the channel 215, and may serve as a passage through which current flows. Thus, the channel 215 and the oxide semiconductor pattern 600 may collectively operate as a channel structure.

Therefore, when compared to current that may flow only through the channel 215 between the contact plug 270 and the bit line 130, the current may flow easily through the channel structure. That is, when compared to a contact plug contacting only the upper surface of the channel 215, the contact plug 270 of the present disclosure may contact an upper surface of the channel structure including the channel 215 and the oxide semiconductor pattern 600. In some embodiments, the oxide semiconductor pattern 600 may have a contact area greater than a contact area of the contact plug. As such, the contact resistance of the contact plug 270 may be reduced.

The oxide semiconductor pattern 600 may include a crystalline oxide semiconductor material unlike the channel 215 including an amorphous oxide semiconductor material, and thus a metal oxide layer, which may be disposed between the channel 215 and the contact plug 270 and may increase the contact resistance, may not be formed between the oxide semiconductor pattern 600 and the contact plug 270, or it may be formed to have a relatively thin thickness. Accordingly, contact resistance between the contact plug 270 and the oxide semiconductor pattern 600 may be lower than contact resistance between the contact plug 270 and the channel 215.

Furthermore, the oxide semiconductor pattern 600, which includes a crystalline oxide semiconductor material, may have a carrier concentration greater than a carrier concentration of the channel 215, which may include an amorphous oxide semiconductor material. As such, the VCT may have an increased on-current.

FIGS. 4 to 27 are plan views and cross-sectional views illustrating a method of manufacturing a semiconductor device in accordance with example embodiments. Specifically, FIGS. 4, 6, 10, 13, 17, 20 and 24 are the plan views, and FIG. 5 is a cross-sectional view taken along a line A-A' of FIG. 4, FIGS. 7, 9, 11, 14-15, 18, 21, 23, 25 and 27 are cross-sectional views taken along lines B-B' of corresponding plan views, respectively, and FIGS. 8, 12, 16, 19, 22 and 26 are cross-sectional views taken along lines C-C' of corresponding plan views, respectively.

Figure 4:
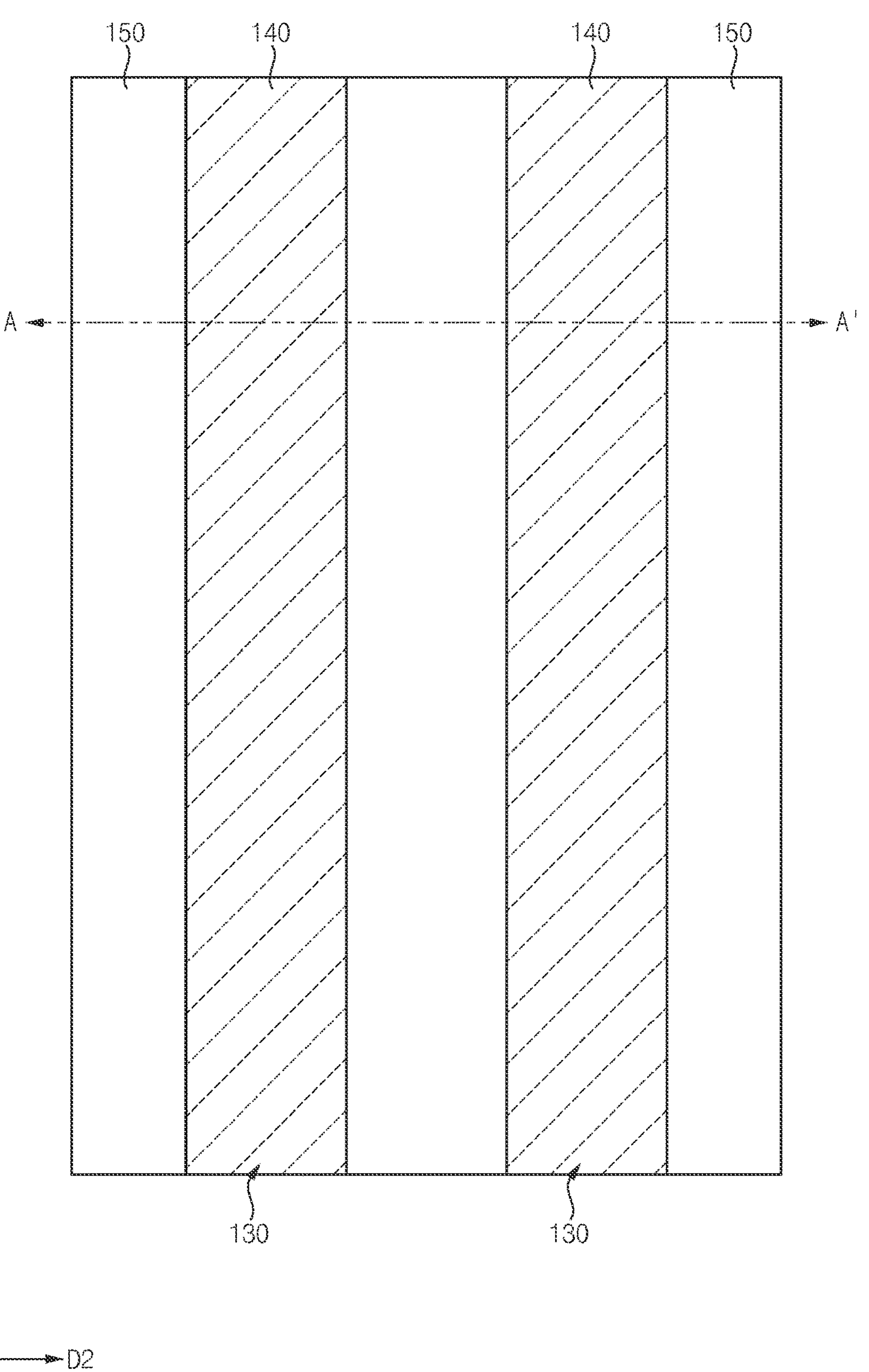
FIG. 4 is a plan view illustrating a method of manufacturing a semiconductor device in accordance with example embodiments of the present disclosure.
Figure 5:
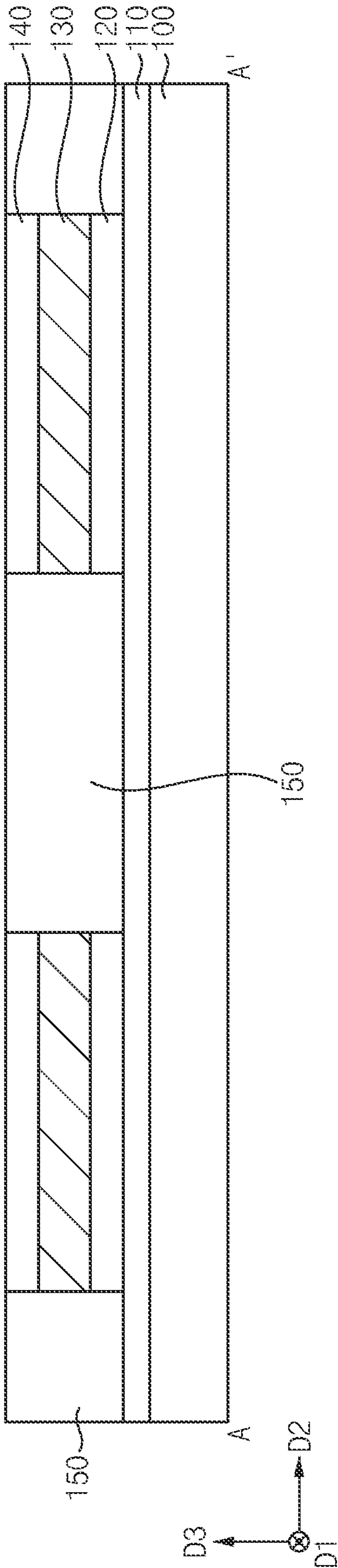
FIG. 5 is a cross-sectional view illustrating a method of manufacturing a semiconductor device in accordance with example embodiments of the present disclosure.

Referring to FIGS. 4 and 5, a first insulation layer 110, a second insulation layer, a bit line layer, and a third insulation layer may be sequentially stacked on a substrate 100, and the third insulation layer, the bit line layer and the second insulation layer may be patterned to form a third insulation pattern 140, a bit line 130, and a second insulation pattern 120, respectively.

In example embodiments, the third insulation layer may include silicon nitride (SiN), silicon oxynitride (SiON), silicon oxycarbonitride (SiOCN), silicon oxycarbide (SiOC), etc. In an example embodiment, the third insulation layer may be formed by a deposition process, e.g., a chemical vapor deposition (CVD) process, an atomic layer deposition (ALD) process, etc., which may use silane ($SiH_4$) gas, nitrogen trifluoride ($NF_3$), argon (Ar), etc. Thus, the third insulation layer may include silicon nitride (SiN), which may contain hydrogen (H). In some embodiments, after the insulation layer is formed by the deposition process, hydrogen ions may be doped into the third insulation layer.

The second insulation pattern 120, the bit line 130 and the third insulation pattern 140 sequentially stacked on the first insulation layer 110 may be collectively referred to as a "bit line structure." In example embodiments, the bit line structure may extend in the first direction D1 on the substrate 100, and a plurality of bit line structures may be spaced apart from each other in the second direction D2. Thus, a first opening, which may expose an upper surface of the first insulation layer 110, may be formed between the bit line structures neighboring in the second direction D2.

A first insulating interlayer layer may be formed on the bit line structures and the first insulation layer 110 to fill the first opening, and an upper portion of the first insulating interlayer may be planarized until upper surfaces of the bit line structures are exposed. A first insulating interlayer pattern 150 extending in the first direction D1 may be formed between the bit line structures.

In example embodiments, the planarization process may include, e.g., a chemical mechanical polishing (CMP) process and/or an etch-back process.

Figure 6:
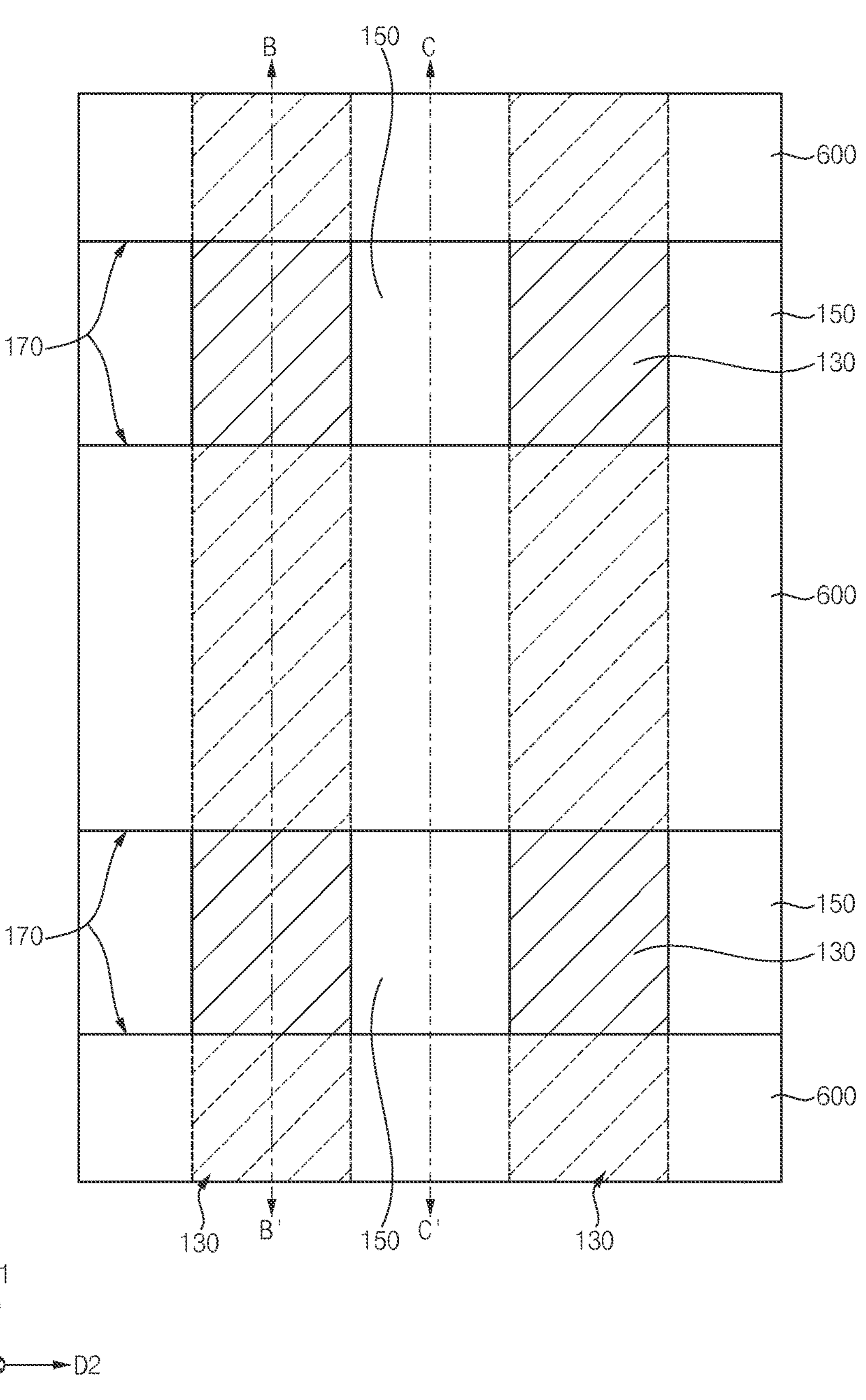
FIG. 6 is a plan view illustrating a method of manufacturing a semiconductor device in accordance with example embodiments of the present disclosure.
Figure 7:
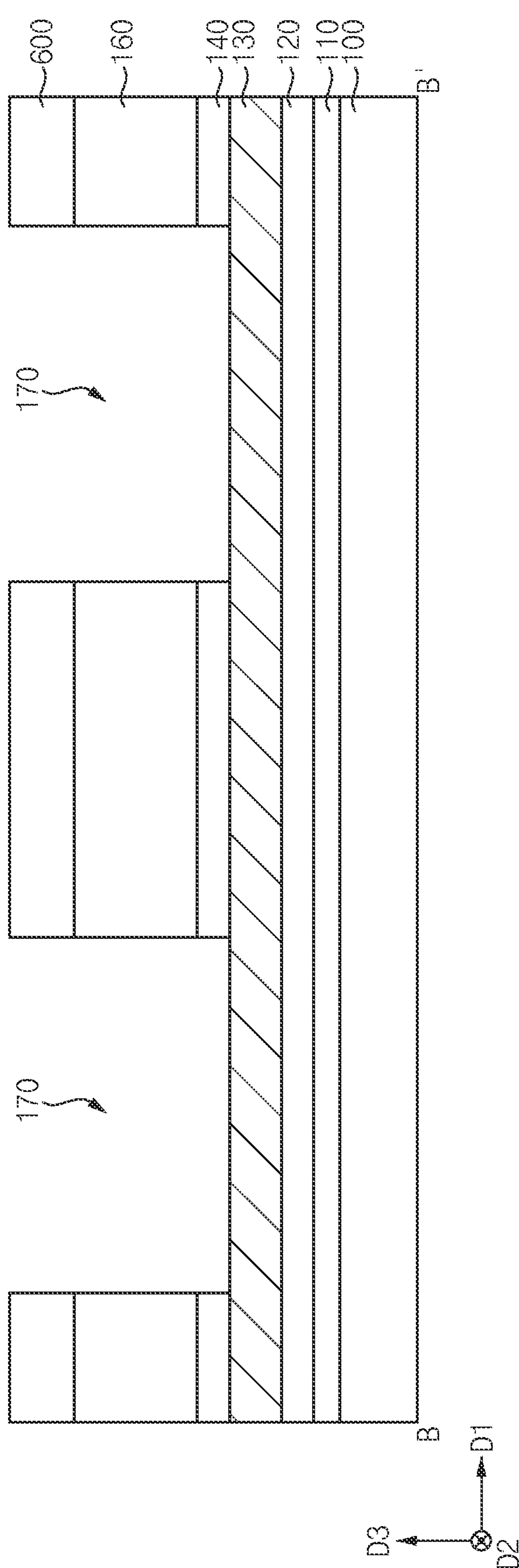
FIGS. 7, 8, and 9 are cross-sectional views illustrating a method of manufacturing a semiconductor device in accordance with example embodiments of the present disclosure.
Figure 8:
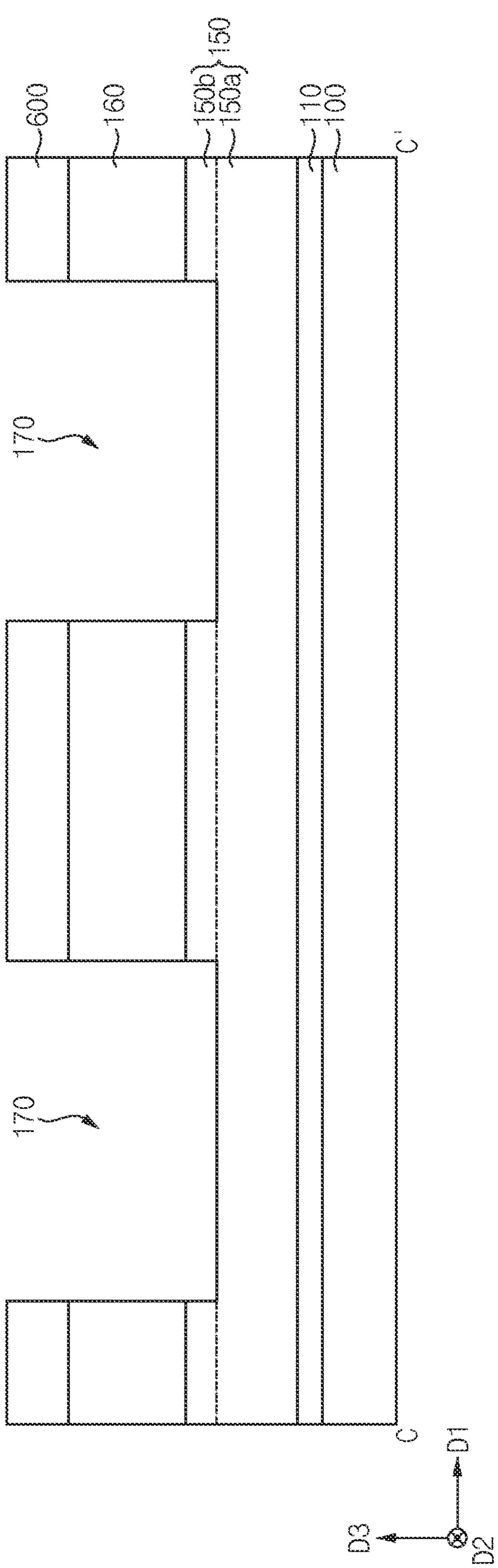

Referring to FIGS. 6 to 8, a second insulating interlayer and an oxide semiconductor layer may be sequentially formed on the bit line structures and the first insulation patterns 150. The second insulating interlayer may be partially removed by, e.g., a dry etching process to form a second opening 170, which may expose upper surfaces of the third insulation pattern 140 and the first insulating interlayer pattern 150 and extend in the second direction D2.

Accordingly, the oxide semiconductor layer may be divided into a plurality of oxide semiconductor patterns 600, each of which may extend in the second direction D2, spaced apart from each other in the first direction D1. The second insulating interlayer may be divided into a plurality of second insulating interlayer patterns 160, each of which may extend in the second direction D2, spaced apart from each other in the first direction D1.

In example embodiments, the oxide semiconductor layer may include a crystalline oxide semiconductor material.

A portion of the third insulation pattern 140, which may be exposed by the second opening 170, may be removed to divide the third insulation pattern 140, which may extend in the first direction D1, into a plurality of third insulation patterns 140 spaced apart from each other in the first direction D1. An upper portion of the first insulating interlayer pattern 150, which may be exposed by the second opening 170, may also be removed.

Accordingly, the first insulating interlayer pattern 150 may include a lower portion 150*a*, which may be formed on the first insulation layer 110 and substantially coplanar with the second insulation pattern 120 and the bit line 130. Furthermore, the first insulating interlayer pattern 150 may include an upper portion 150*b*, which may be formed on the lower portion 150*a* and adjacent to the third insulation pattern 140 in the second direction D2. As the third insulation pattern 140 is divided into a plurality of third insulation patterns 140 spaced apart from each other in the first direction D1, the upper portion 150*b* of the first insulating interlayer pattern 150 may also be divided into a plurality of the upper portions 150*b* spaced apart from each other in the first direction D1.

Hereinafter, the third insulation pattern 140, the upper portion 150*b* of the first insulating interlayer pattern 150, and the second insulating interlayer pattern 160 and the oxide semiconductor pattern 600 sequentially stacked in the third direction D3 on the third insulation pattern 140 and the upper portion 150*b* of the first insulating interlayer pattern 150 may be referred to as a "bar structure." In example embodiments, the bar structure may extend in the second direction D2, and a plurality of bar structures may be spaced apart from each other in the first direction D1.

Figure 9:
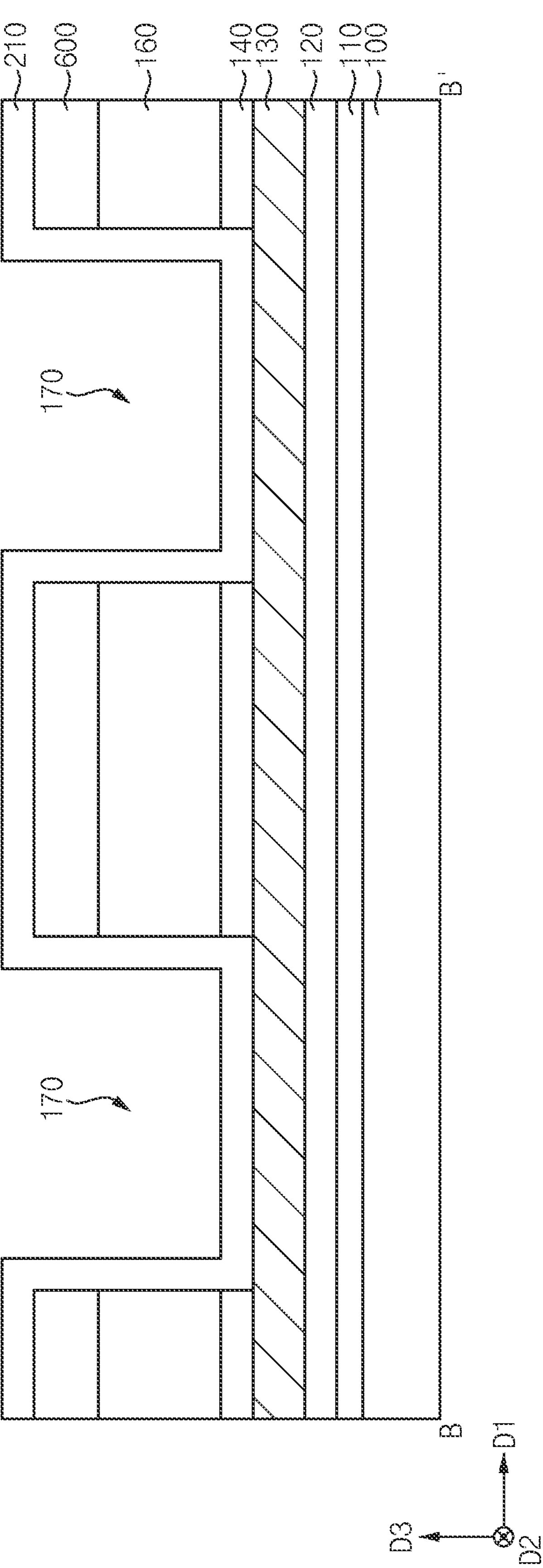

Referring to FIG. 9, a channel layer 210 may be formed on upper surfaces of the bit line 130 and the first insulating interlayer pattern 150, which may be exposed by the second opening 170, and a sidewall and an upper surface of the bar structure.

In example embodiment, the channel layer 210 may be formed by a deposition process, e.g., an ALD process, a CVD process, etc., at a relatively low temperature, and may include an amorphous oxide semiconductor material.

Figure 10:
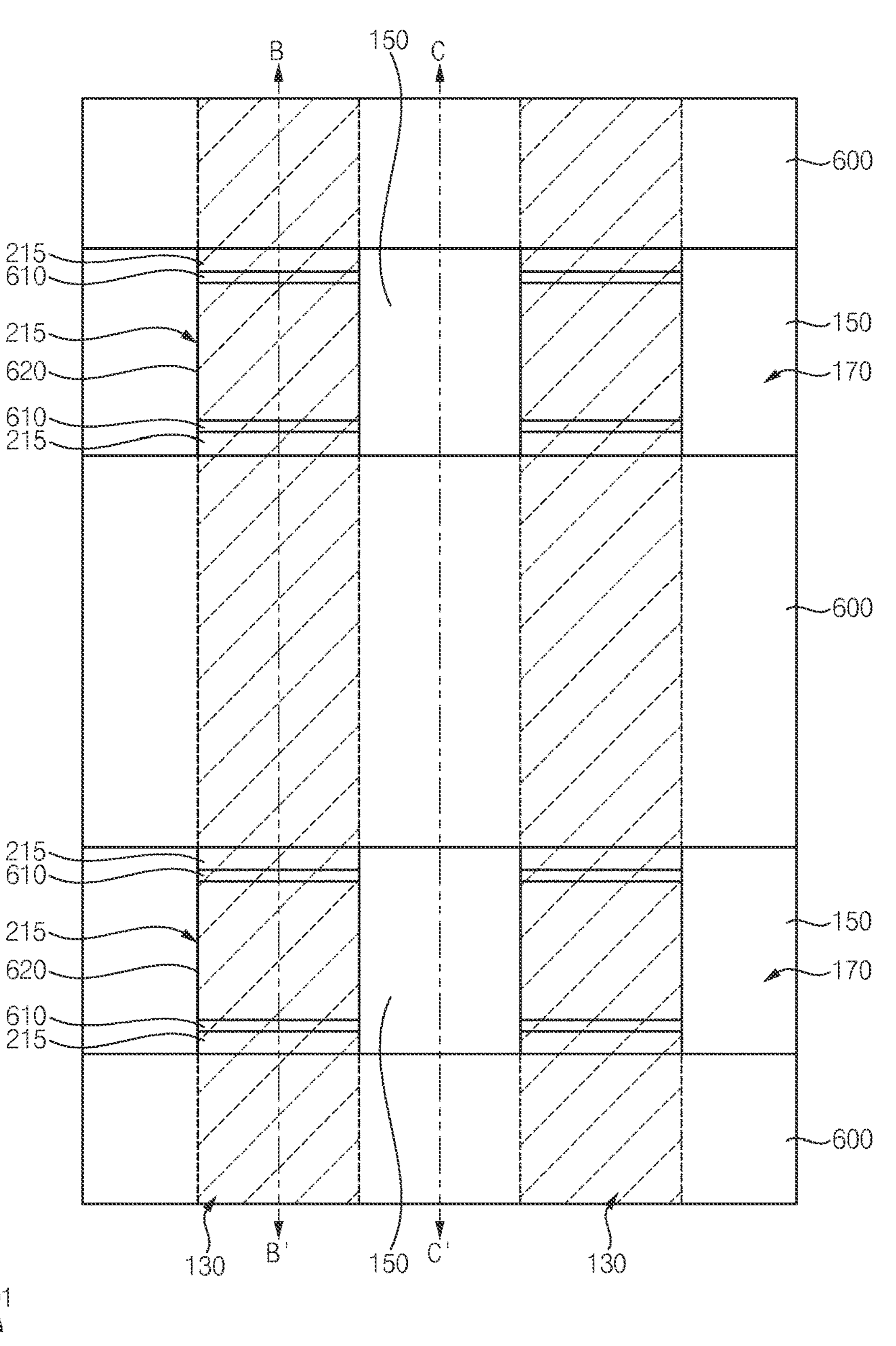
FIG. 10 is a plan view illustrating a method of manufacturing a semiconductor device in accordance with example embodiments of the present disclosure.
Figure 11:
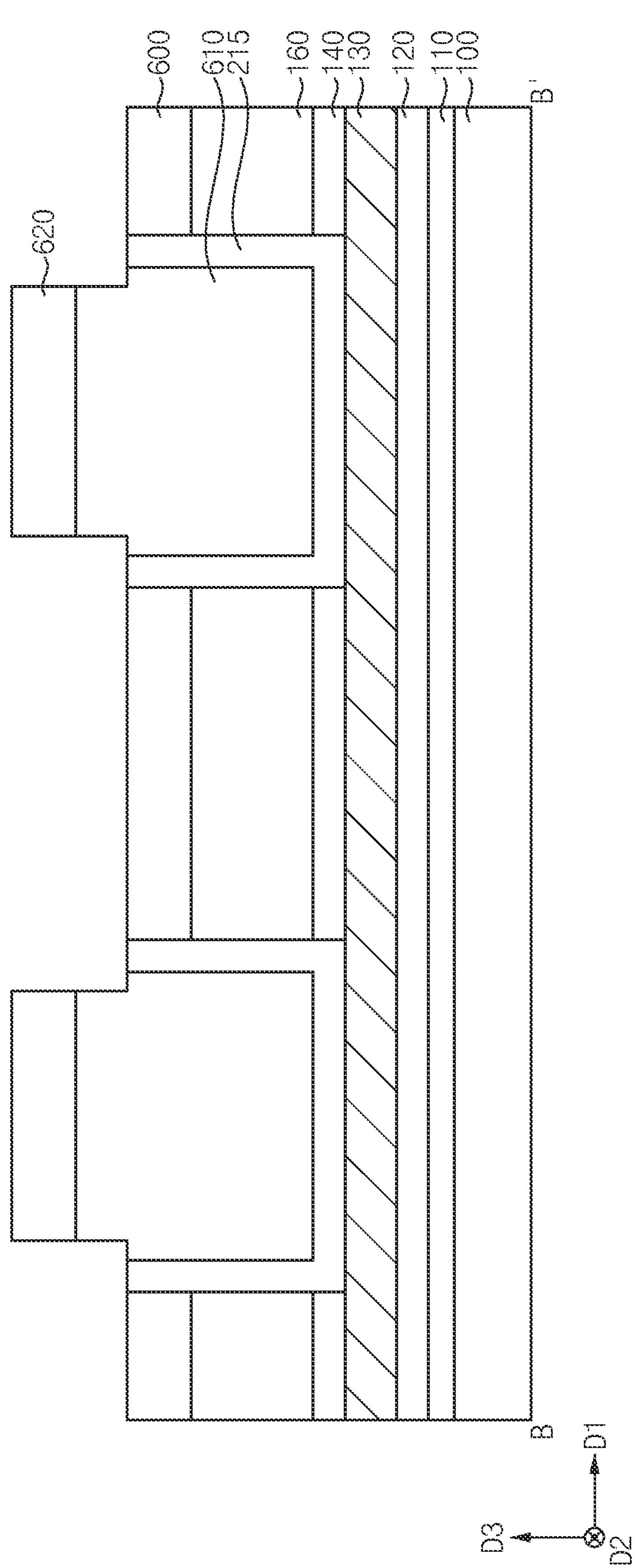
FIGS. 11 and 12 are cross-sectional views illustrating a method of manufacturing a semiconductor device in accordance with example embodiments of the present disclosure.
Figure 12:
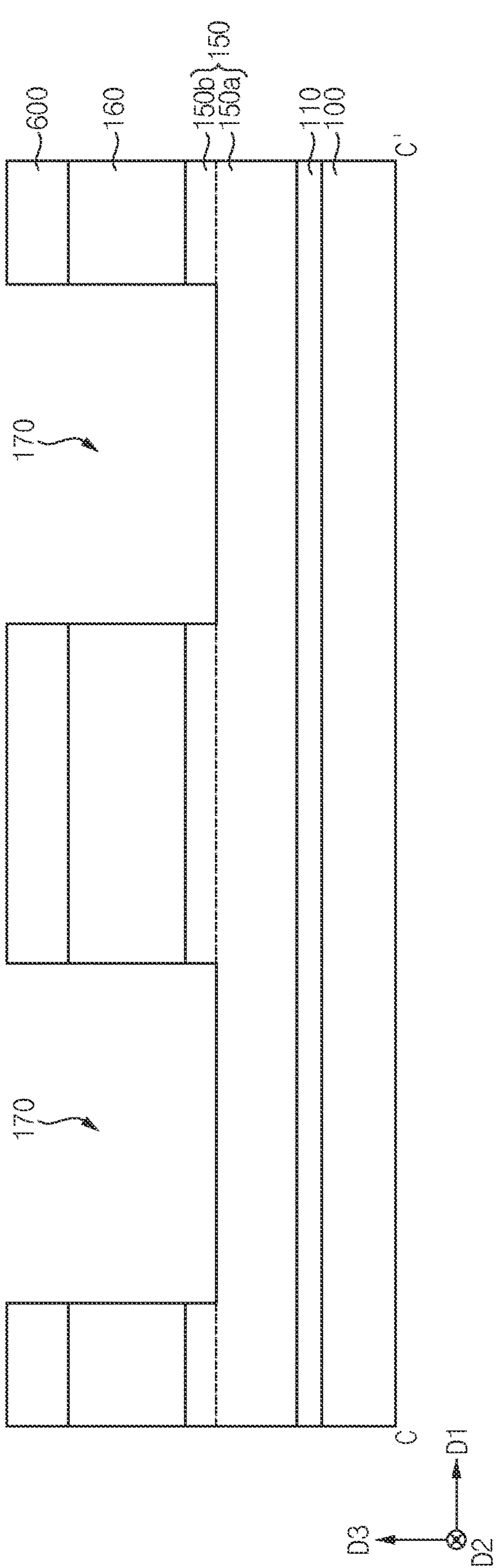

Referring to FIGS. 10 to 12, a sacrificial layer may be formed on the channel layer 210, a mask 620 may be formed on the sacrificial layer, and the sacrificial layer and the channel layer 210 may be partially removed by an etching process using the mask 620 as an etching mask. As such, upper surface of the oxide semiconductor pattern 600 and an upper surface of the first insulating interlayer pattern 150 may be exposed.

The mask 620 may include, e.g., a photoresist pattern, and the sacrificial layer may include, e.g., a spin-on-hardmask (SOH), an amorphous carbon layer (ACL), etc.

Through the etching process, the sacrificial layer and the channel layer 210 may be transformed into a sacrificial pattern 610 and a channel 215, respectively.

In example embodiments, a plurality of masks 620 may be spaced apart from each other in the first and second directions D1 and D2, and may overlap in the third direction D3 a portion of the bit line 130 exposed by the second opening 170. Accordingly, a plurality of channels 215 may be spaced apart from each other in the first and second directions D1 and D2 on the portion of the bit line 130 exposed by the second opening 170. Furthermore, a plurality of sacrificial patterns 610 may be spaced apart from each other in the first and second directions D1 and D2 on the portion of the bit line 130 exposed by the second opening 170.

Figure 13:
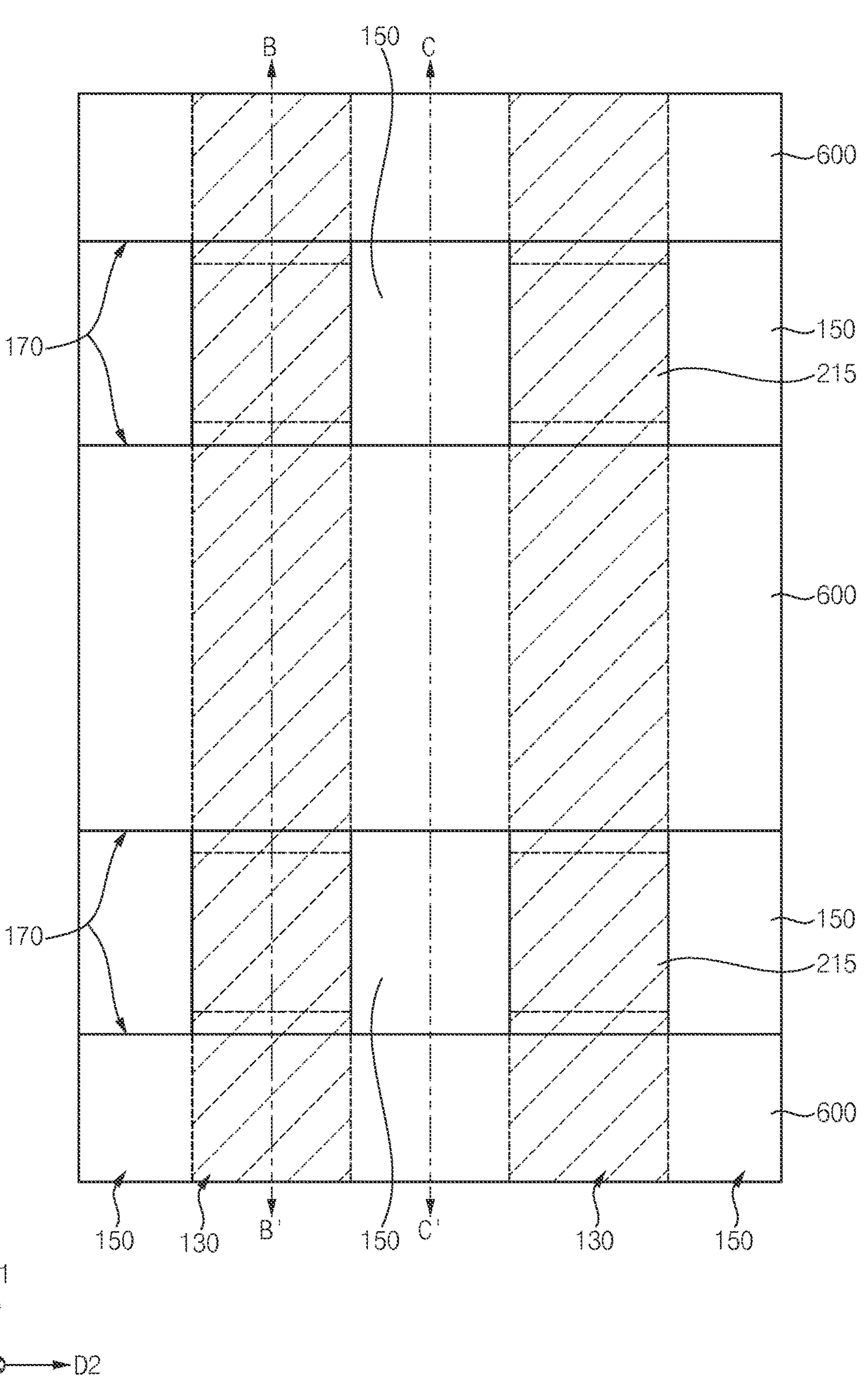
FIG. 13 is a plan view illustrating a method of manufacturing a semiconductor device in accordance with example embodiments of the present disclosure.
Figure 14:
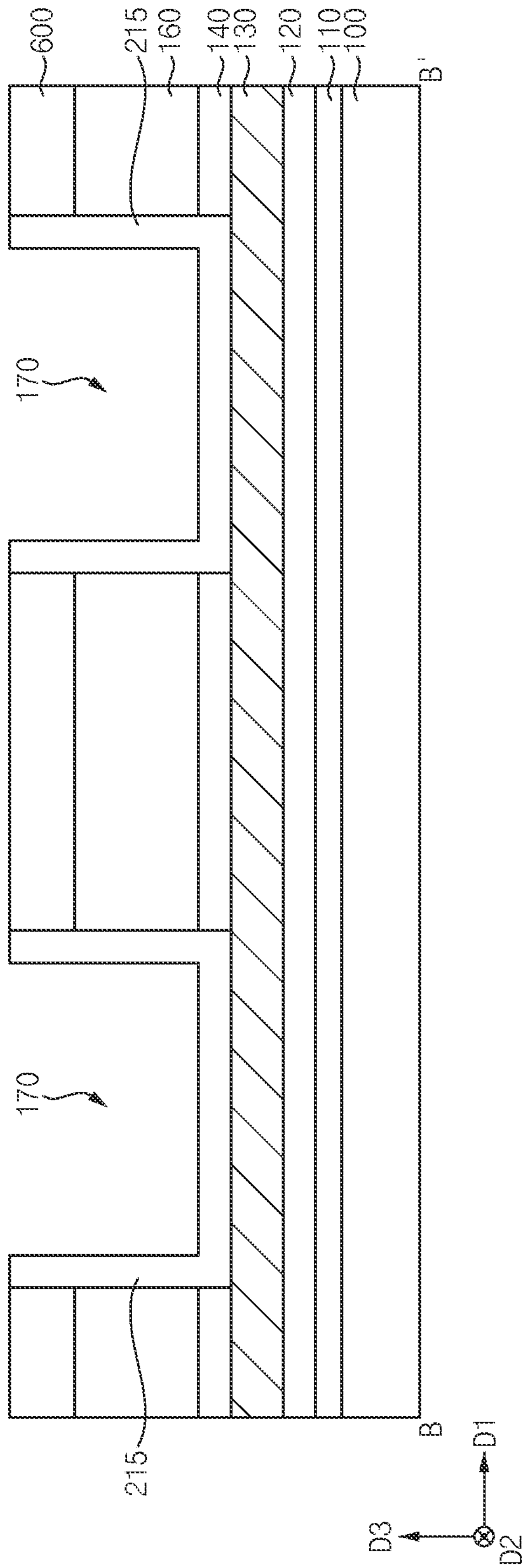
FIGS. 14, 15, and 16 are cross-sectional views illustrating a method of manufacturing a semiconductor device in accordance with example embodiments of the present disclosure.

Referring to FIGS. 13 and 14, the mask 620 and the sacrificial pattern 610 may be removed by, e.g., an ashing and/or stripping process.

Accordingly, an upper surface of the channel 215 may be exposed again.

Figure 15:
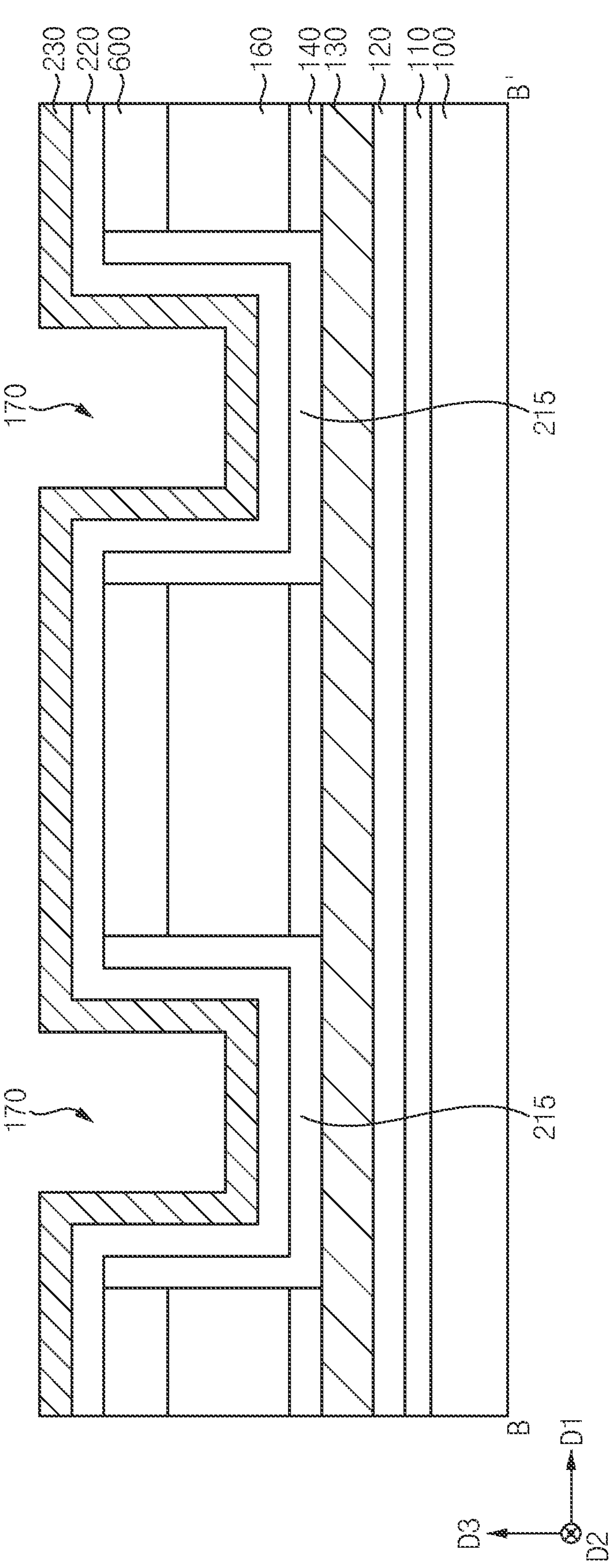
Figure 16:
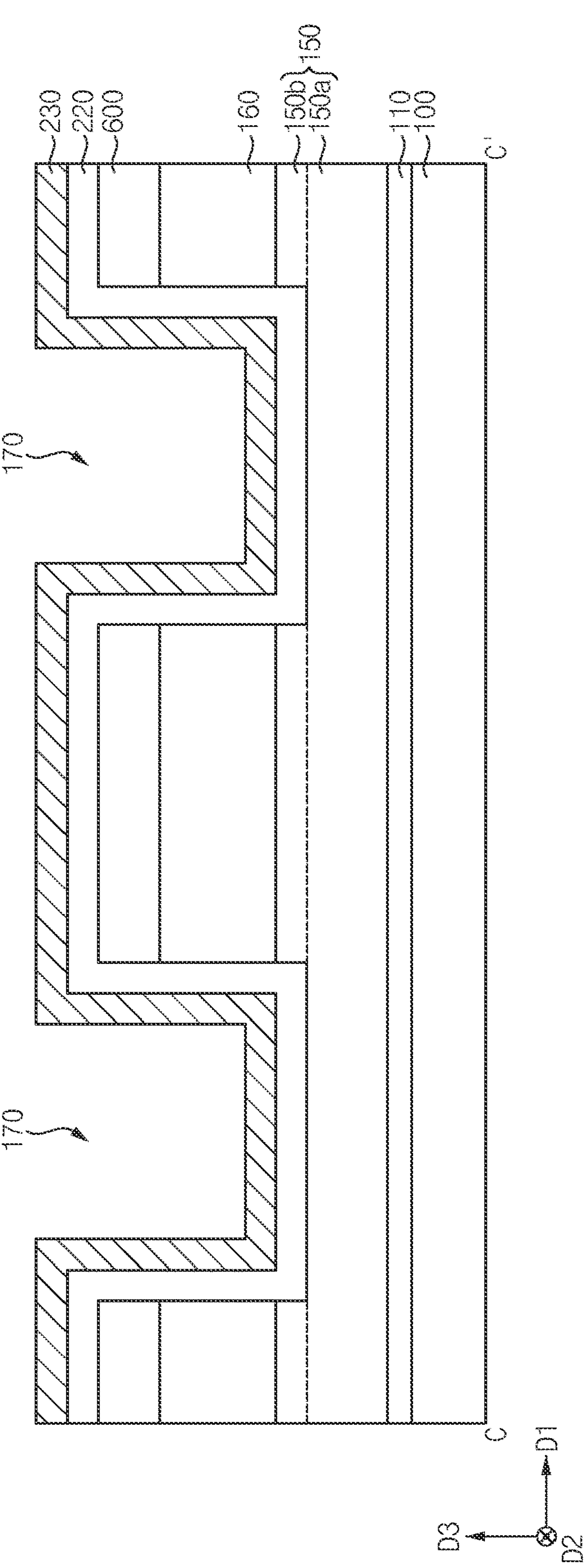

Referring to FIGS. 15 and 16, a gate insulation layer 220 and a gate electrode layer 230 may be sequentially formed on the channel 215, the first insulating interlayer pattern 150 and the oxide semiconductor pattern 600.

In example embodiments, the gate insulation layer 220 and the gate electrode layer 230 may be formed by a deposition process, e.g., a CVD process or an ALD process at a relatively high temperature.

Figure 17:
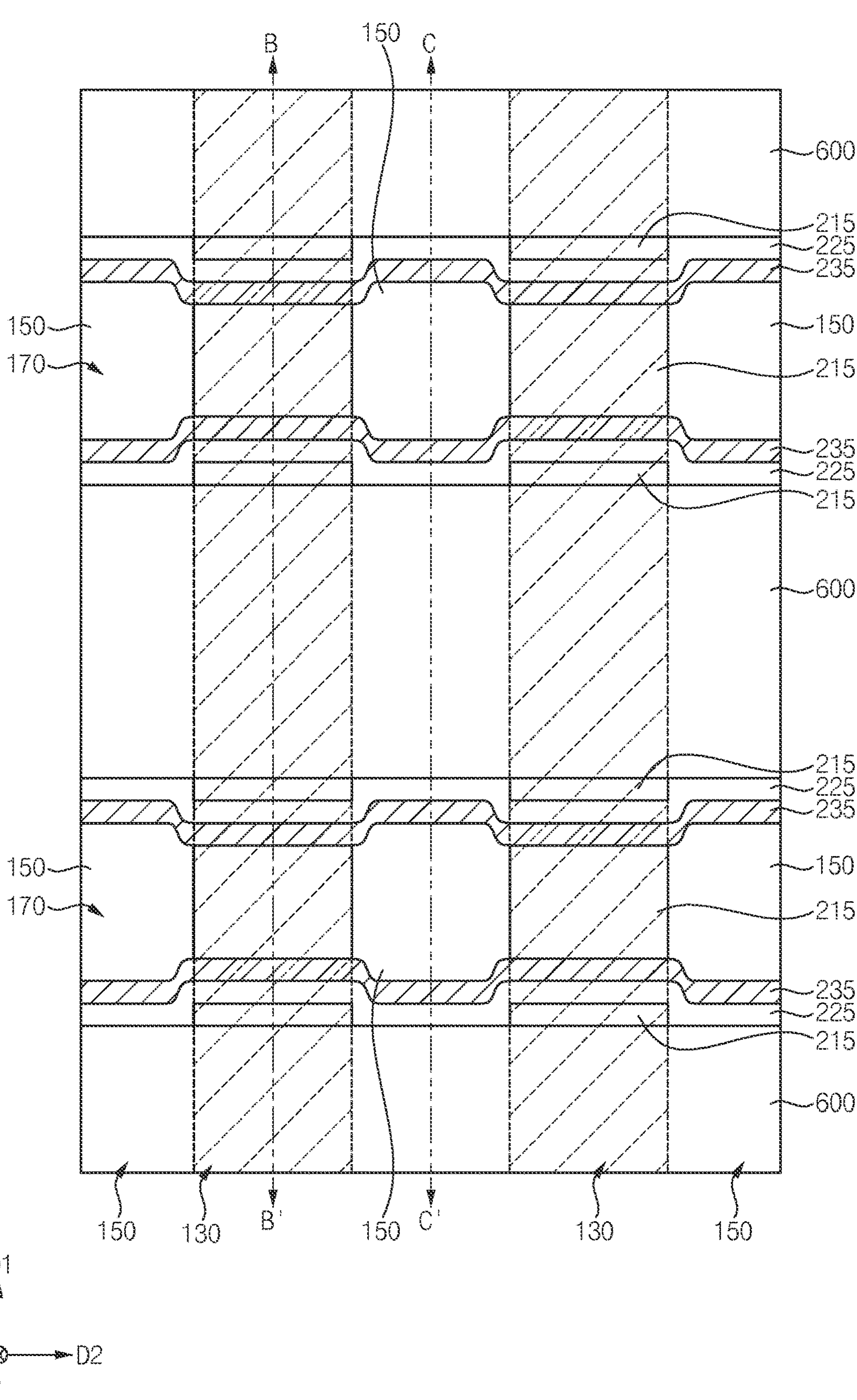
FIG. 17 is a plan view illustrating a method of manufacturing a semiconductor device in accordance with example embodiments of the present disclosure.
Figure 18:
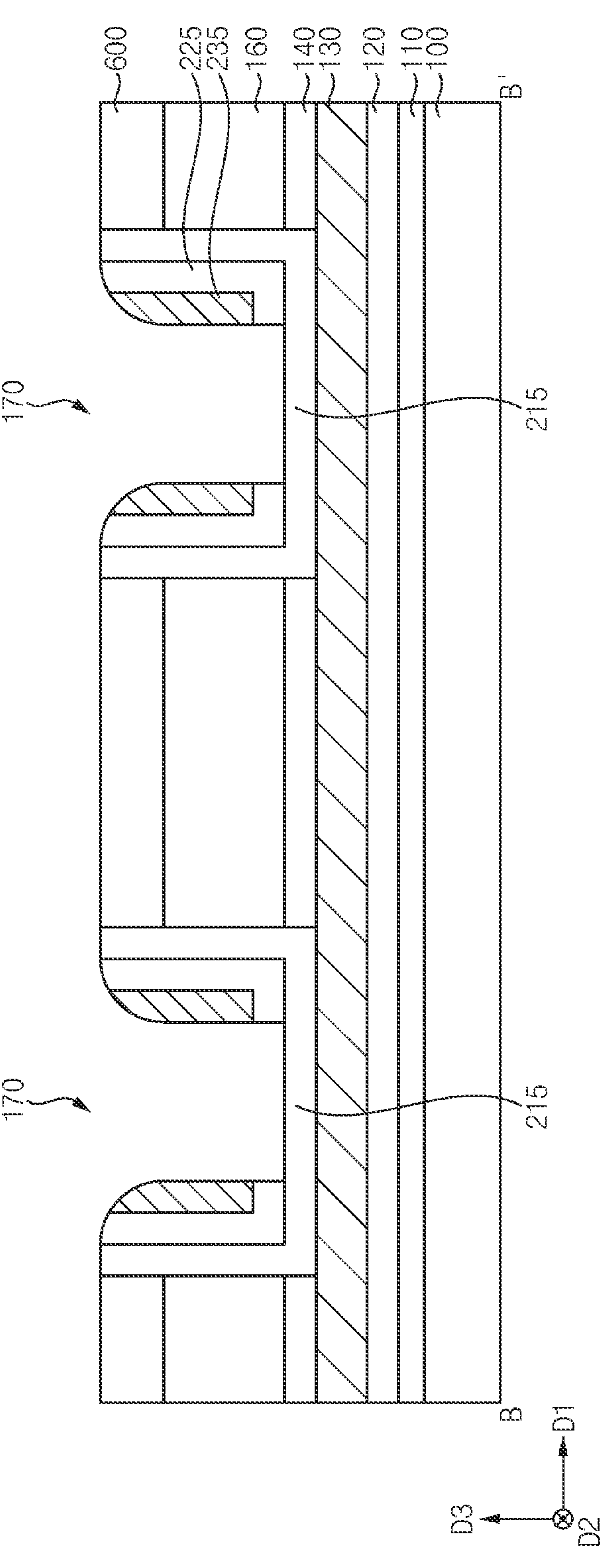
FIGS. 18 and 19 are cross-sectional views illustrating a method of manufacturing a semiconductor device in accordance with example embodiments of the present disclosure.
Figure 19:
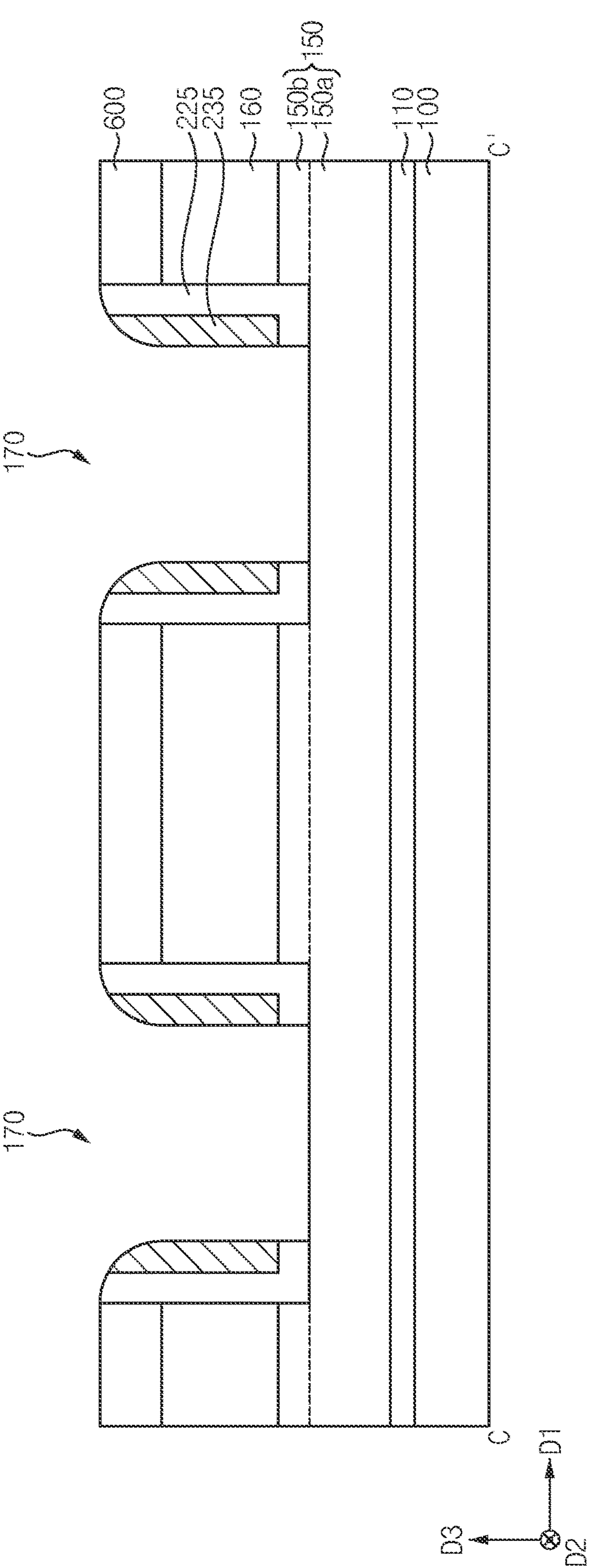

Referring to FIGS. 17 to 19, an anisotropic etching process may be performed on the gate electrode layer 230 and the gate insulation layer 220, which may be transformed into a gate electrode 235 and a gate insulation pattern 225, respectively.

In example embodiments, the gate insulation pattern 225 and the gate electrode 235 may be sequentially stacked on an inner sidewall of a portion of the channel 215 on each of opposite sidewalls of the second opening 170 in the first direction D1 and a sidewall of the bar structure.

Hereinafter, a portion of the gate insulation pattern 225, which may contact the portion of the channel 215 on each of opposite sidewalls of the second opening in the first direction D1, may be referred to as a "first portion of the gate insulation pattern 225." Hereinafter, a portion of the gate insulation pattern 225, which may contact the sidewall of the bar structure, may be referred to as a "second portion of the gate insulation pattern 225." Also, a portion of the gate electrode 235 on the first portion of the gate insulation pattern 225 may be referred to as a "first portion of the gate electrode 235," and a portion of the gate electrode 235 on the second portion of the gate insulation pattern 225 may be referred to as a "second portion of the gate electrode 235."

In example embodiments, the gate insulation pattern 225 may extend in the second direction D2. However, the gate insulation pattern 225 may not extend in a straight line in the second direction D2, but may extend in a curve in the second direction D2, in a plan view. That is, the first portion and the second portion of the gate insulation pattern 225 may not be aligned with each other in the second direction D2 due to the channel 215. As the first and second portions of the gate insulation pattern 225 are alternately and repeatedly disposed in the second direction D2, the gate insulation pattern 225 may extend in a curve in the second direction D2.

In example embodiments, lower surfaces of the first and second portions, respectively, of the gate insulation pattern 225 may be formed at different heights from each other. That is, the first portion of the gate insulation pattern 225 may contact the upper surface of the portion of the channel 215 on the upper surface of the bit line 130. As such, a lower surface of the first portion of the gate insulation pattern 225 may be substantially coplanar with the upper surface of the portion of the channel 215 on the upper surface of the bit line 130. On the other hand, the second portion of the gate insulation pattern 225 may contact an upper surface of the lower portion 150*a* of the first insulating interlayer pattern 150, which may be substantially coplanar with the upper surface of the bit line 130. As such, a lower surface of the second portion of the gate insulation pattern 225 may be substantially coplanar with upper surface of the lower portion 150*a* of the first insulating interlayer pattern 150. Accordingly, the lower surface of the first portion of the gate insulation pattern 225 may be higher than the lower surface of the second portion thereof. Thus, a height of the lower surface of the gate insulation pattern 225 may vary periodically in the second direction D2.

In example embodiments, a cross-section in the first direction D1 of each of the first and second portions of the gate insulation pattern 225 may have an "L" shape.

Similarly to the gate insulation pattern 225, the gate electrode 235 may also extend in the second direction D2. However, the gate electrode 235 may not extend in a straight line in the second direction D2, but may extend in a curve in the first direction D2. In addition, a height of a lower surface of the gate electrode 235 may vary periodically in the second direction D2.

Figure 20:
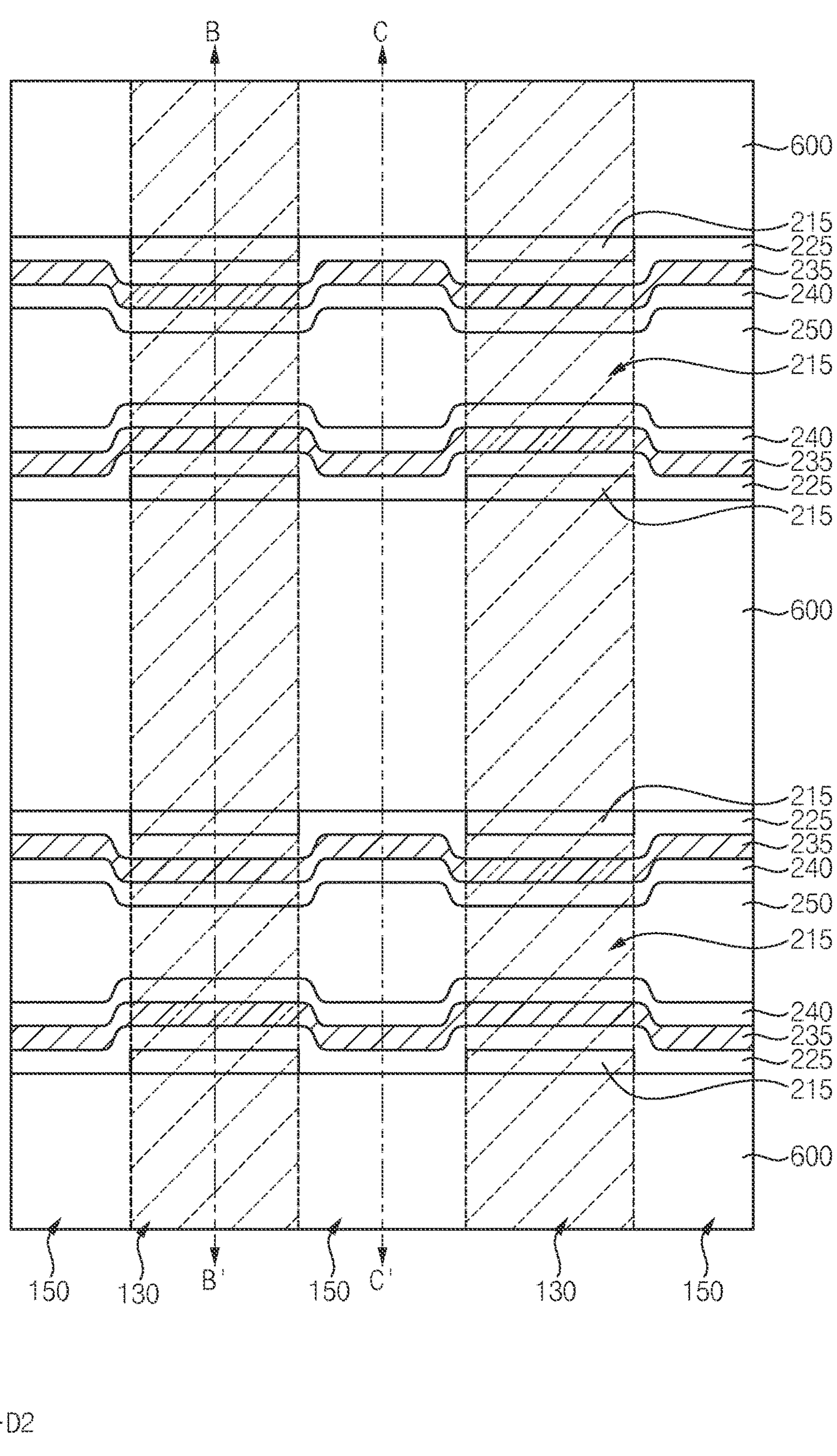
FIG. 20 is a plan view illustrating a method of manufacturing a semiconductor device in accordance with example embodiments of the present disclosure.
Figure 21:
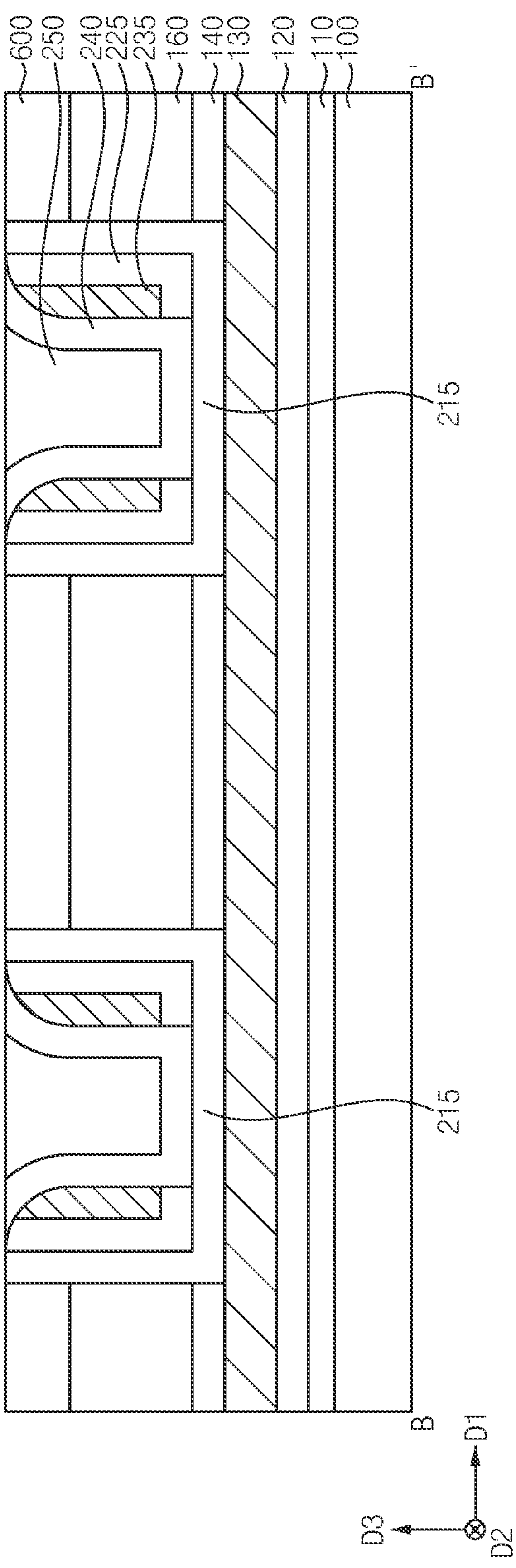
FIGS. 21, 22, and 23 are cross-sectional views illustrating a method of manufacturing a semiconductor device in accordance with example embodiments of the present disclosure.
Figure 22:
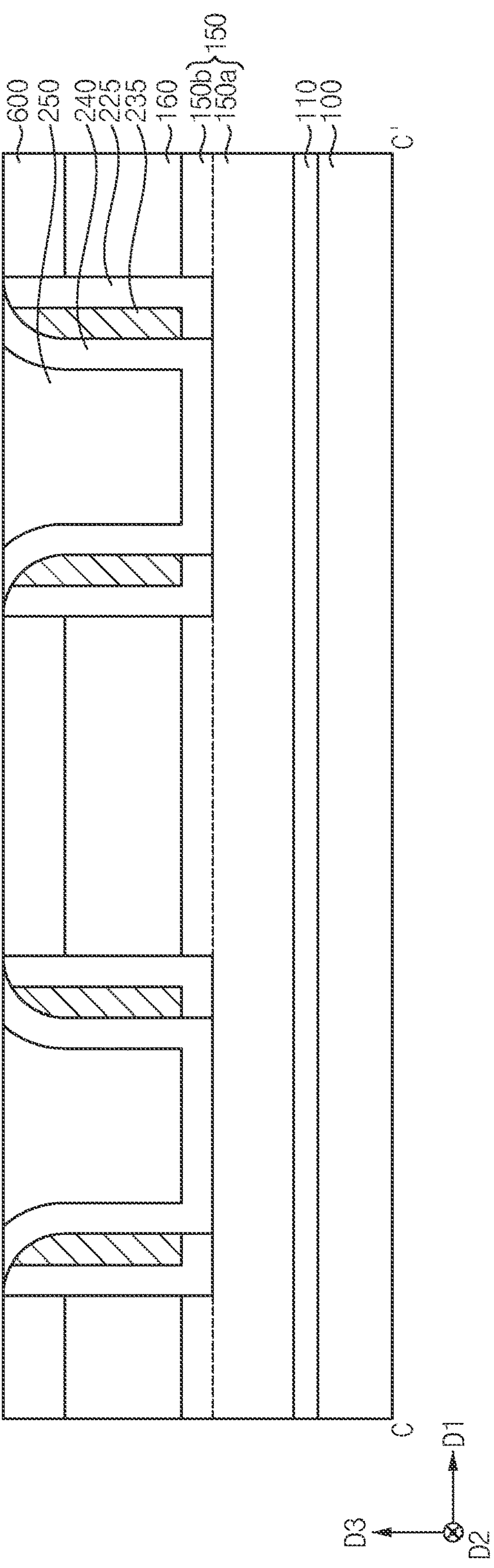

Referring to FIGS. 20 to 22, a fourth insulation layer may be formed on the channel 215, the first insulating interlayer pattern 150, the gate insulation pattern 225, the gate electrode 235 and the oxide semiconductor pattern 600. Furthermore, a third insulating interlayer may be formed on the fourth insulation layer to fill a remaining portion of the second opening 170, and a planarization process may be performed on an upper portion of the third insulating interlayer and an upper portion of the fourth insulation layer until an upper surface of the oxide semiconductor pattern 600 is exposed.

In example embodiments, the planarization process may include a CMP process and/or an etch-back process. As the planarization process is performed, the third insulating interlayer and the fourth insulation layer may remain as a third insulating interlayer pattern 250 and a fourth insulation pattern 240, respectively, in the second opening 170. Each of the fourth insulation pattern 240 and the third insulating interlayer pattern 250 may extend in the second direction D2 on the channel 215 and the first insulating interlayer pattern 150.

Figure 23:
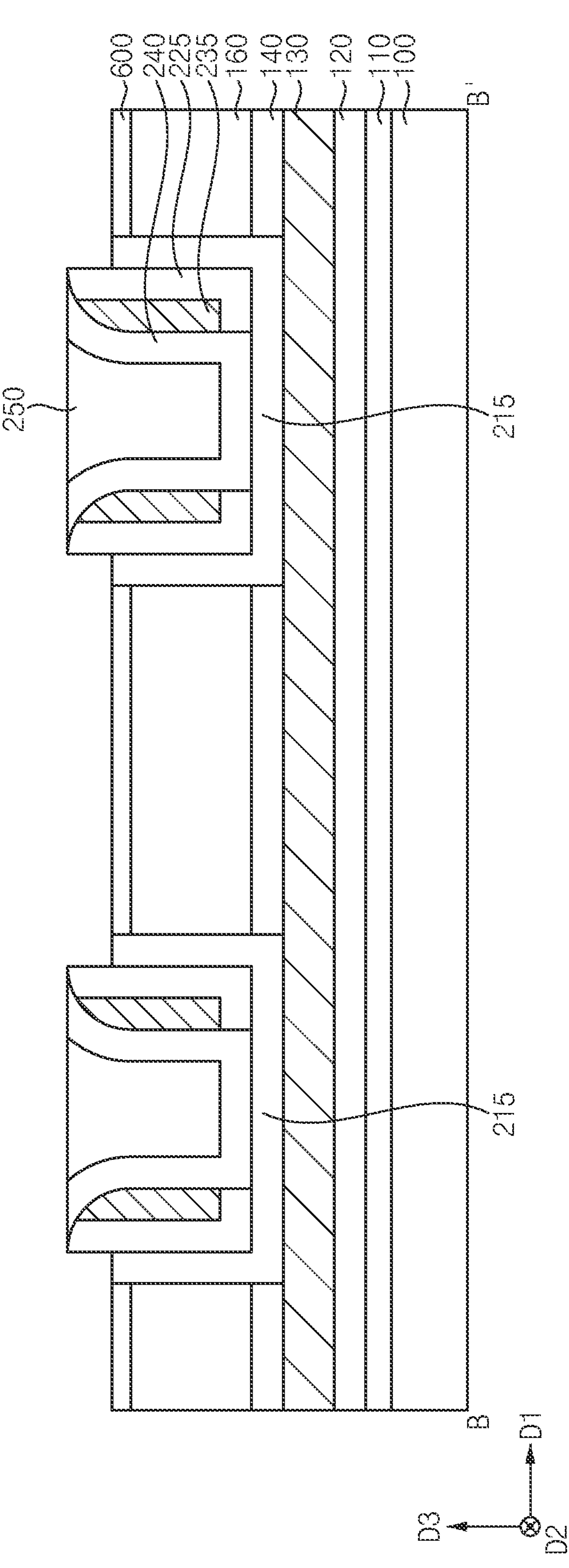

Referring to FIG. 23, an upper portion of the oxide semiconductor pattern 600 may be removed by, e.g., a wet etching process, and an upper portion of the channel 215 may also be removed.

Accordingly, the upper surface of the oxide semiconductor pattern 600 and a top surface of the channel 215 may extend less than upper surfaces of the gate insulation pattern 225, the gate electrode 235, the fourth insulation pattern 240, and the third insulating interlayer pattern 250.

Figure 24:
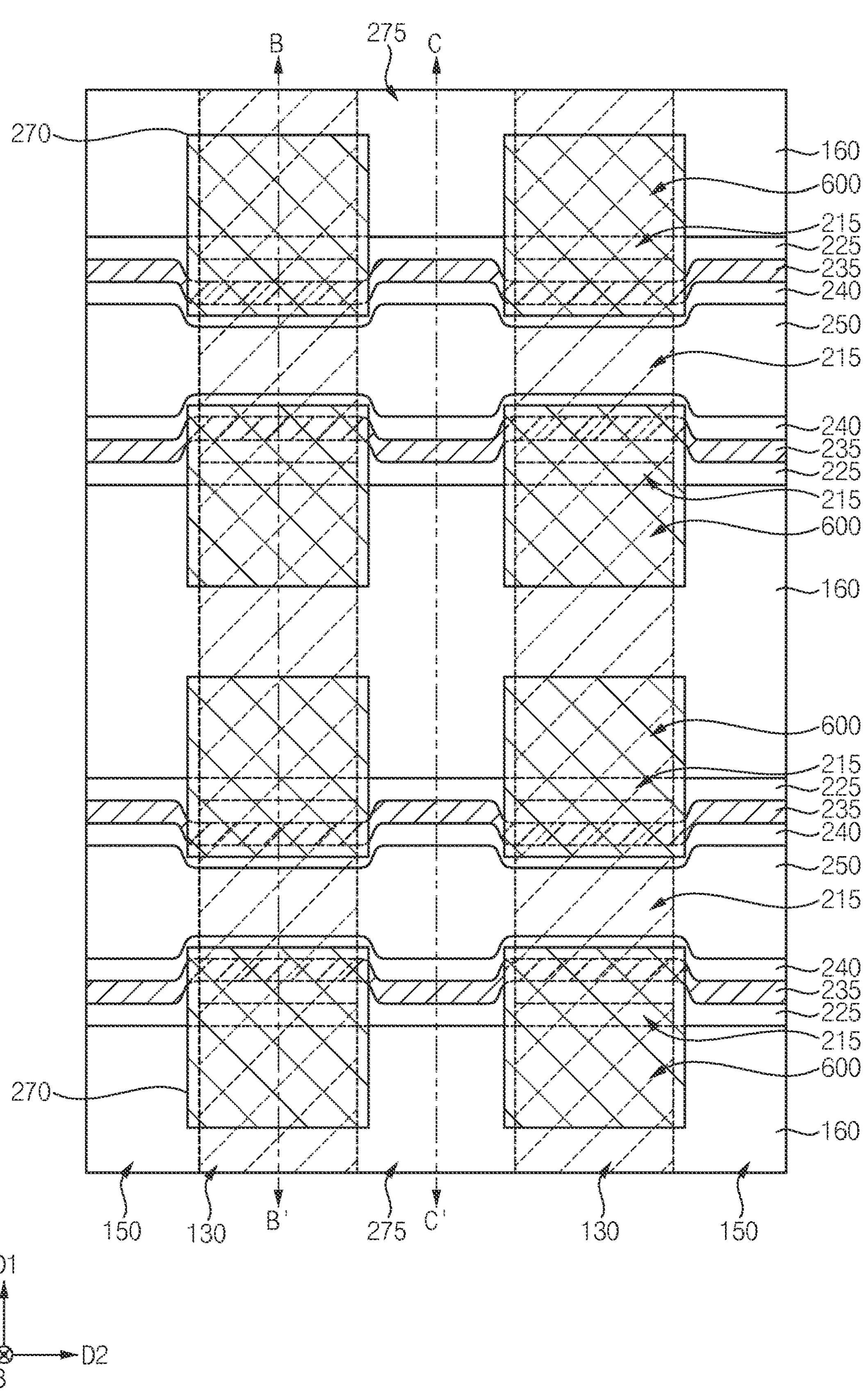
FIG. 24 is a plan view illustrating a method of manufacturing a semiconductor device in accordance with example embodiments of the present disclosure.
Figure 25:
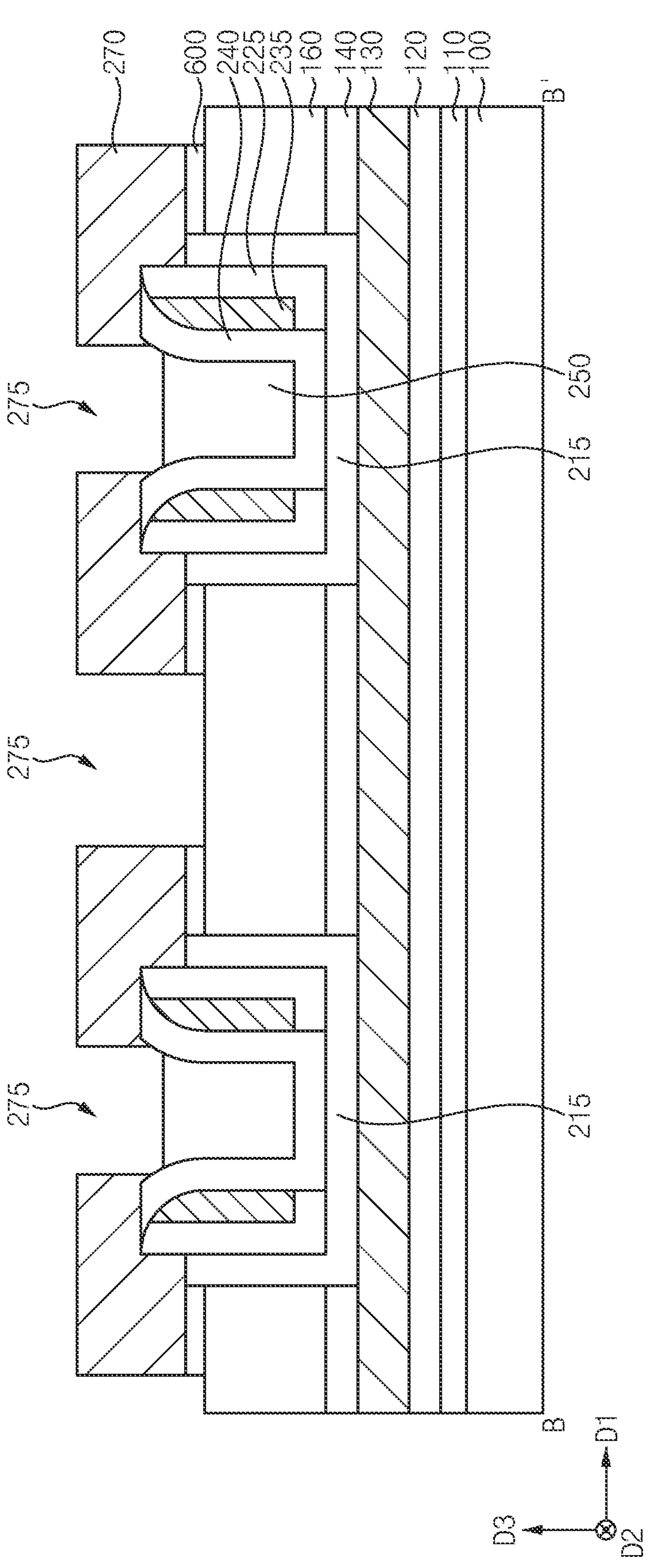
FIGS. 25, 26, and 27 are cross-sectional views illustrating a method of manufacturing a semiconductor device in accordance with example embodiments.
Figure 26:
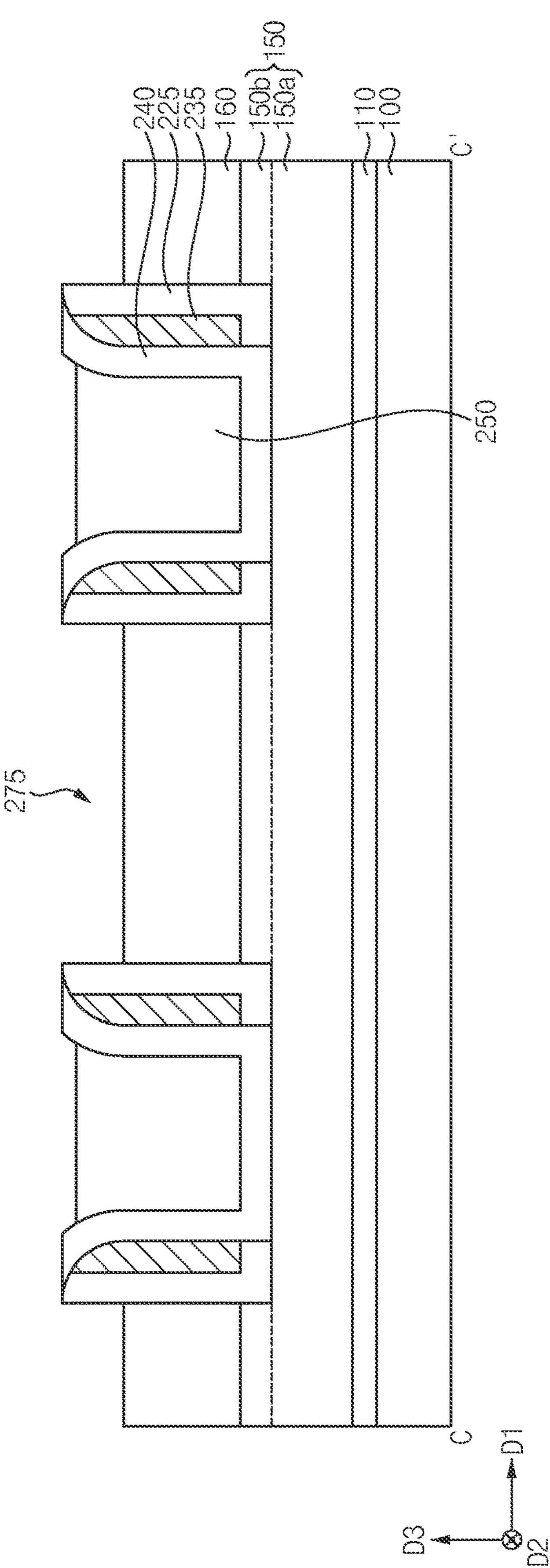

Referring to FIGS. 24 to 26, a contact plug layer may be formed on the oxide semiconductor pattern 600, the channel 215, the gate insulation pattern 225, the gate electrode 235, the fourth insulation pattern 240 and the third insulating interlayer pattern 250. The contact plug layer and the oxide semiconductor pattern 600 may be partially removed by an etching process.

During the etching process, an upper portion of the third insulating interlayer pattern 250 may also be partially removed.

Accordingly, the contact plug layer may be divided into a plurality of contact plugs 270 spaced apart from each other in the first and second directions D1 and D2. Additionally, a third opening 275, which may expose upper surfaces of the second and third insulating interlayer patterns 160 and 250 and the fourth insulation pattern 240, may be formed between the contact plugs 270.

In an example embodiment, the contact plugs 270 may be disposed in a lattice pattern in a plan view. In another example embodiment, the contact plugs 270 may be disposed in a honeycomb pattern in a plan view.

As the etching process is performed, the oxide semiconductor pattern 600, which may be included in the bar structure, may remain only under the contact plug 270, and may be divided into a plurality of parts spaced apart from each other in the second direction D2 on the second insulating interlayer pattern 160 extending in the second direction D2. Hereinafter, other portions of the bar structure except for the oxide semiconductor pattern 600 (that is, the third insulation pattern 140, the upper portion 150*b* of the first insulating interlayer pattern 150 and the second insulating interlayer pattern 160) may be collectively referred to as an "insulation structure." The insulation structure may extend in the second direction D2, and a plurality of insulation structures may be spaced apart from each other in the first direction D1.

Figure 27:
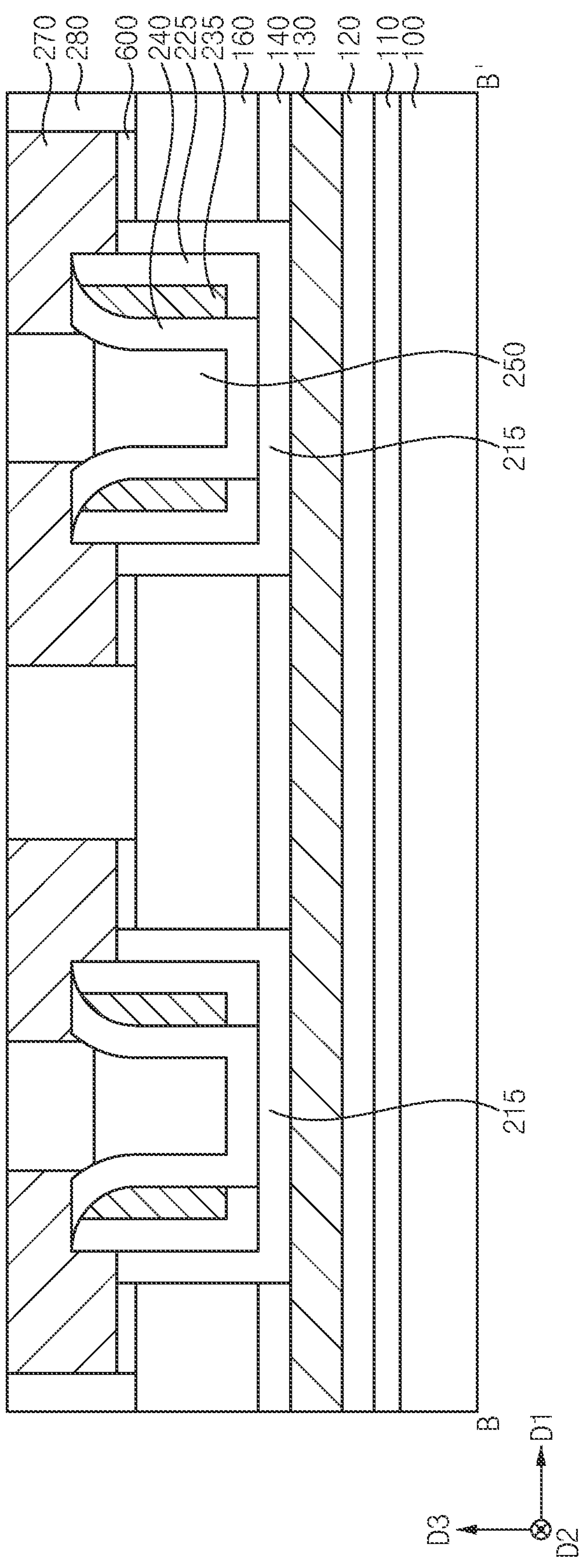

Referring to FIG. 27, a fourth insulating interlayer pattern 280 may be formed to fill the third opening 275.

In example embodiments, the fourth insulating interlayer pattern 280 may be formed by forming a fourth insulating interlayer on the second and third insulating interlayer patterns 160 and 250, the fourth insulation pattern 240 and the contact plug 270 to fill the third opening 275. The fourth insulating interlayer pattern 280 may further be formed by planarizing an upper portion of the fourth insulation interlayer until an upper surface of the contact plug 270 is exposed.

Referring back to FIGS. 1 to 3, a first capacitor electrode 300 may be formed to contact the upper surface of the contact plug 270, a dielectric layer 290 may be formed on an upper surface and a sidewall of the first capacitor electrode 300 and an upper surface of the fourth insulating interlayer pattern 280, and a second capacitor electrode 310 may be formed on a surface of the dielectric layer 290 to form a capacitor 320.

Accordingly, fabrication of the semiconductor device may be completed.

As illustrated above, the oxide semiconductor pattern 600 may be formed on the second insulating interlayer pattern 160, the channel 215 may be formed to contact a sidewall of the oxide semiconductor pattern 600, the upper portions of the oxide semiconductor pattern 600 and the channel 215 may be removed, and the contact plug 270 may be formed to contact the upper surfaces of the oxide semiconductor pattern 600 and the channel 215. Thus, the contact plug 270 may contact not only the upper surface of the channel 215 but also the upper surface of the oxide semiconductor pattern 600. As such, a contact area of the contact plug 270 may be greater than a contact area thereof when compared to a case where the contact plug 270 contacts only the upper surface of the channel 215.

Unlike the channel 215 including an amorphous oxide semiconductor material, the oxide semiconductor pattern 600 may include a crystalline oxide semiconductor material. Thus, when compared to a metal oxide layer that may be formed between the channel 215 and the contact plug 270, a metal oxide layer that may be formed between the oxide semiconductor pattern 600 and the contact plug 270 may have a relatively thin thickness, or no metal oxide layer may be formed between the oxide semiconductor pattern 600 and the contact plug 270. Accordingly, a contact resistance between the oxide semiconductor pattern 600 and the contact plug 270 may be lower than a contact resistance between the channel 215 and the contact plug 270.

Furthermore, the oxide semiconductor pattern 600, which may include a crystalline oxide semiconductor material, may have a carrier concentration greater than a carrier concentration of the channel 215, which may include an amorphous oxide semiconductor material. Thus, a VCT including the oxide semiconductor pattern 600 may have an increased on-current.

Figure 28:
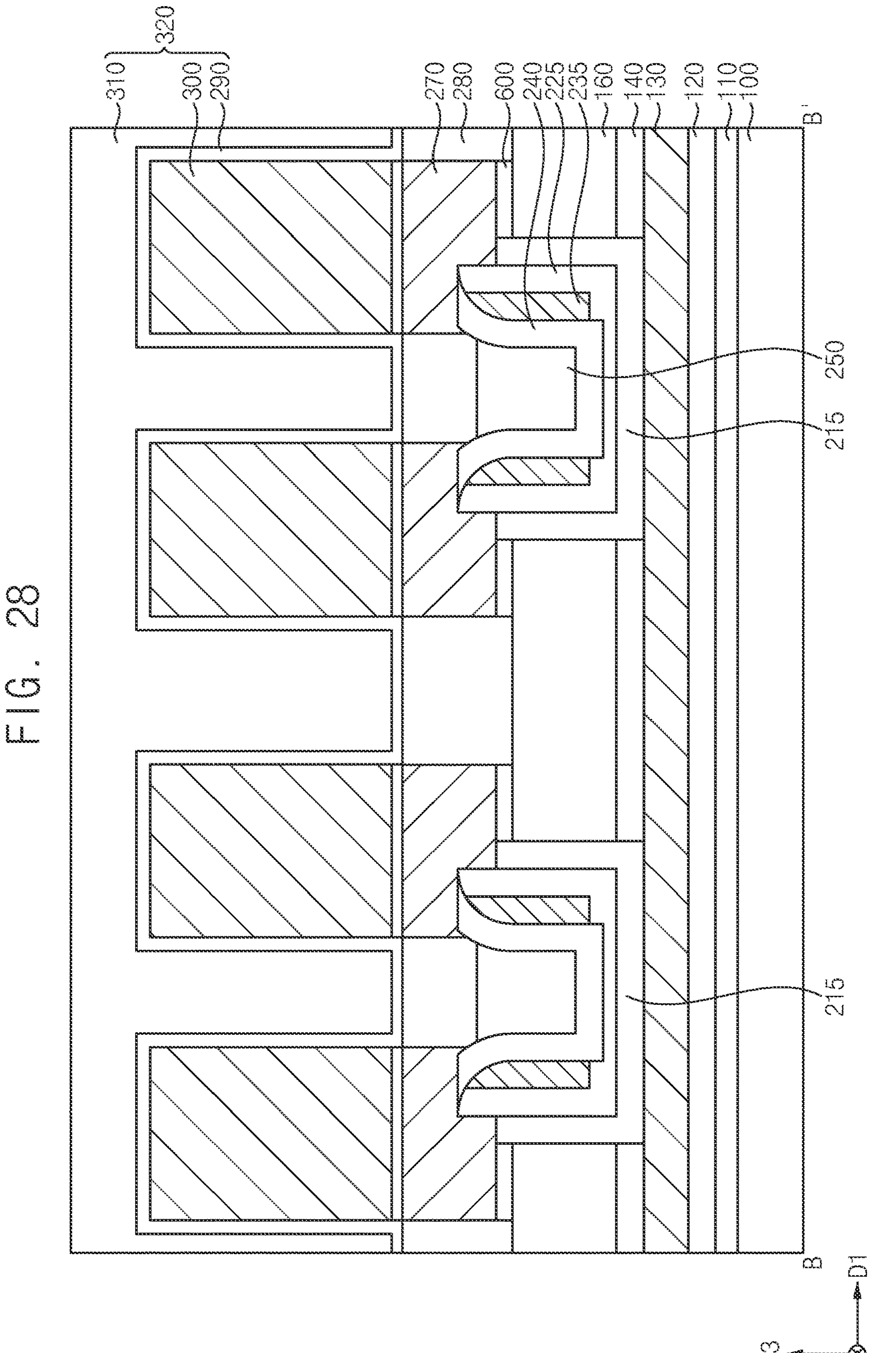
FIG. 28 is a cross-sectional view illustrating a semiconductor device in accordance with example embodiments of the present disclosure.

FIG. 28 is a cross-sectional view illustrating a semiconductor device in accordance with example embodiments, which may correspond to FIG. 2. The semiconductor device may be substantially the same as or similar to that of FIGS. 1 to 3, except for the gate insulation pattern, and thus repeated explanations are omitted herein.

Referring to FIG. 28, the gate insulation pattern 225 may also be formed on the upper surface of the horizontal portion of the channel 215, and the cross-section in the first direction D1 of the gate insulation pattern 225 may have a conical frustrum shape (e.g., a cup shape) instead of an "L" shape.

Figure 29:
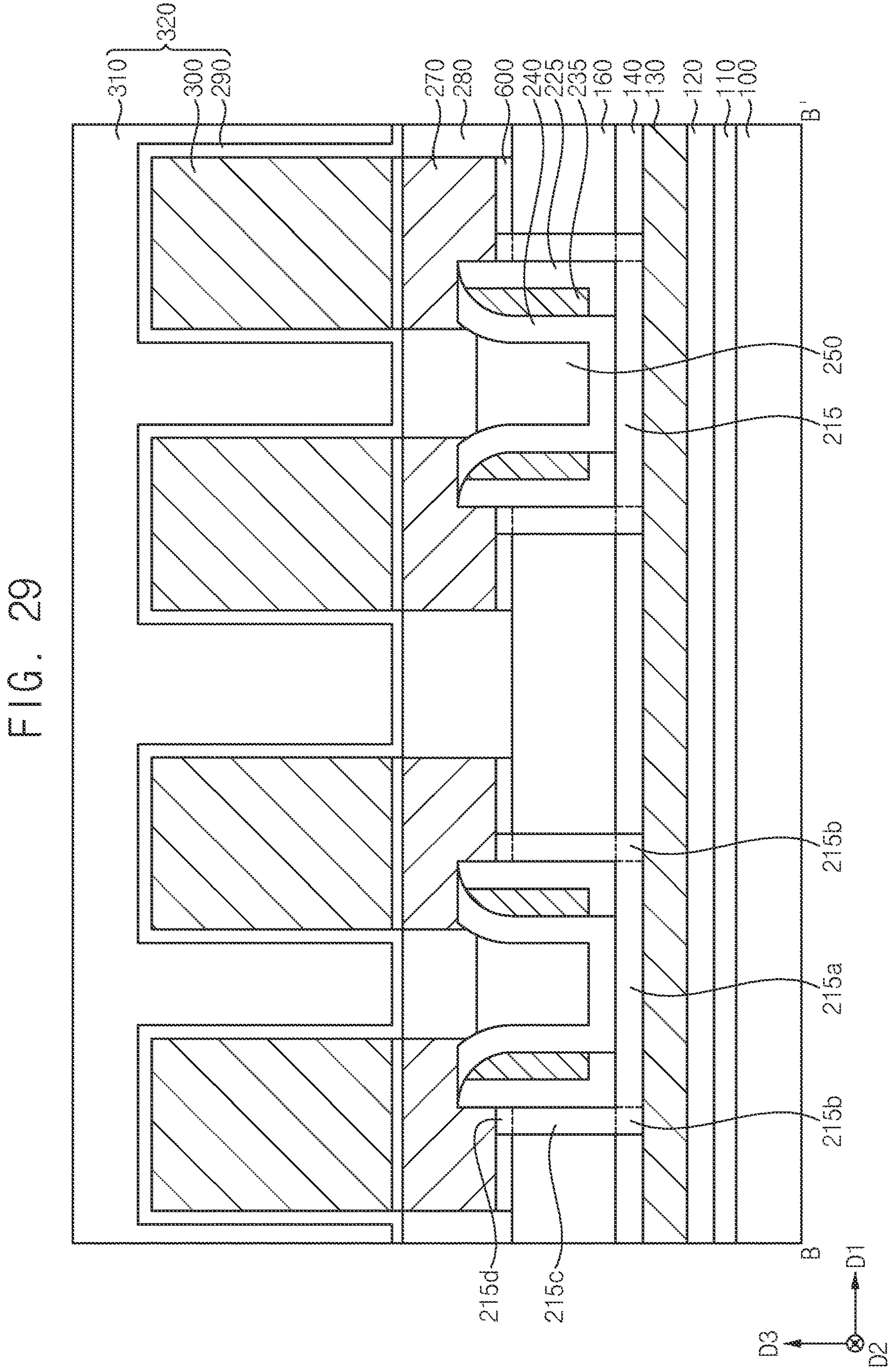
FIG. 29 is a cross-sectional view illustrating a semiconductor device in accordance with example embodiments of the present disclosure.

FIG. 29 is a cross-sectional view illustrating a semiconductor device in accordance with example embodiments, which may correspond to FIG. 2. The semiconductor device may be substantially the same as or similar to that of FIGS. 1 to 3, except for the channel, and thus repeated explanations are omitted herein.

Referring to FIG. 29, the channel 215 may include first to fourth portions 215*a*, 215*b*, 215*c*, and 215*d*.

The first portion 215*a* of the channel 215 may be formed at a central portion in the first direction D1 of the horizontal portion, and may contact the upper surface of the bit line 130. The second portion 215*b* of the channel 215 may be formed at each of opposite edge portions in the first direction D1 of the horizontal portion, and may contact a sidewall of the third insulation pattern 140. The third portion 215*c* of the channel 215 may be formed at a portion of the vertical portion contacting a sidewall of the second insulating interlayer pattern 160. The fourth portion 215*d* of the channel 215 may be formed at a portion of the vertical portion on the third portion 215C, and may contact the sidewall of the oxide semiconductor pattern 600.

In example embodiments, the second portion 215*b* of the channel 215 may further include impurities, e.g., hydrogen in addition to an amorphous oxide semiconductor material, which may be formed by diffusion of hydrogen from the third insulation pattern 140 into a portion of the channel layer 210 adjacent thereto during the process of formation of the channel layer 210 illustrated with reference to FIG. 9.

In example embodiments, the fourth portion 215*d* of the channel 215 may further include impurities, e.g., hydrogen, argon, or fluorine in addition to an amorphous oxide semiconductor material, which may be formed by diffusion of hydrogen, argon, or fluorine into a portion of the channel layer 210 adjacent to the contact plug layer from a source gas used in the process of formation of the contact plug layer illustrated with reference to FIGS. 24 to 26. Components, e.g., hydrogen, argon, and fluorine, etc., included in the source gas may also diffuse into the oxide semiconductor pattern 600, and thus the oxide semiconductor pattern 600 may further include impurities, e.g., hydrogen, argon, or fluorine.

When compared to the first and third portions 215*a* and 215*c* of the channel 215, the second and fourth portions 215*b* and 215*d* may further include impurities in addition to an amorphous oxide semiconductor material. Thus, each of the second and fourth portions 215*b* and 215*d* may have a relatively high carrier concentration, so as to have conductivity. Each of the second and fourth portions 215*b* and 215*d* of the channel 215 may be referred to as a source/drain layer that may be distinguished from the first and third portions 215*a* and 215*c*. In this embodiment, the oxide semiconductor pattern 600, which may include a crystalline oxide semiconductor material and impurities, may also operate as a part of the source/drain layer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:

a bit line on a substrate;

a gate electrode on the bit line;

a gate insulation pattern on a sidewall of the gate electrode;

a channel that contacts an upper surface of the bit line and a sidewall of the gate insulation pattern, the channel including an amorphous oxide semiconductor material;

an oxide semiconductor pattern that contacts an upper sidewall of the channel, the oxide semiconductor pattern including a crystalline oxide semiconductor material; and a contact plug that contacts a top surface of the channel and an upper surface of the oxide semiconductor pattern.

2. The semiconductor device according to claim 1, wherein a sidewall of the contact plug and a sidewall of the oxide semiconductor pattern are aligned with each other in a vertical direction substantially perpendicular to an upper surface of the substrate.

3. The semiconductor device according to claim 1, wherein the upper surface of the channel is substantially coplanar with the upper surface of the oxide semiconductor pattern.

4. The semiconductor device according to claim 1, wherein a distance of a top surface of the gate insulation pattern from an upper surface of the substrate is greater than a distance of a top surface of the channel from the upper surface of the substrate.

5. The semiconductor device according to claim 4, wherein the gate insulation pattern is between the gate electrode and the channel.

6. The semiconductor device according to claim 1, wherein the gate insulation pattern is on a lower surface of the gate electrode.

7. The semiconductor device according to claim 1, further comprising an insulation pattern between the gate electrode and the contact plug, wherein the insulation pattern separates the gate electrode and the contact plug from each other.

8. The semiconductor device according to claim 7, wherein the insulation pattern is on another sidewall of the gate electrode, another sidewall of the gate insulation pattern and an upper surface of a portion of the channel that contacts the upper surface of the bit line.

9. The semiconductor device according to claim 7, wherein the insulation pattern is on another sidewall of the gate electrode and an upper surface of a portion of the gate insulation pattern that contacts a portion of an upper surface of the channel.

10. The semiconductor device according to claim 1, further comprising a capacitor on the contact plug.

11. A semiconductor device comprising:

a bit line on a substrate;

a gate electrode on the bit line;

a gate insulation pattern on a sidewall of the gate electrode;

a channel that contacts an upper surface of the bit line and a sidewall of the gate insulation pattern;

an oxide semiconductor pattern that contacts an upper portion of a sidewall of the channel; and a contact plug that contacts a top surface of the channel and an upper surface of the oxide semiconductor pattern, wherein a sidewall of the contact plug and a sidewall of the oxide semiconductor pattern are aligned with each other in a vertical direction substantially perpendicular to an upper surface of the substrate.

12. The semiconductor device according to claim 11, wherein the bit line extends in a first direction substantially parallel to the upper surface of the substrate, and wherein, in the first direction, a sidewall of the contact plug is aligned with a sidewall of the oxide semiconductor pattern.

13. The semiconductor device according to claim 11, wherein in a first direction substantially parallel to the upper surface of the substrate:

the gate insulation pattern is on a sidewall of the gate electrode, the channel contacts a sidewall of the gate insulation pattern, and the oxide semiconductor pattern contacts an upper portion of a sidewall of the channel.

14. The semiconductor device according to claim 11, further comprising an insulation pattern between the gate electrode and the contact plug, wherein the insulation pattern separates the gate electrode and the contact plug from each other, wherein the insulation pattern contacts another sidewall of the gate electrode in a first direction substantially parallel to the upper surface of the substrate.

15. The semiconductor device of claim 11, wherein the channel includes an amorphous oxide semiconductor material, and the oxide semiconductor pattern includes a crystalline oxide semiconductor material.

16. A semiconductor device comprising:

bit lines on a substrate, wherein the bit lines each extend in a first direction substantially parallel to an upper surface of the substrate, and wherein the bit lines are spaced apart from each other in a second direction that is substantially parallel to the upper surface of the substrate and intersects the first direction;

gate electrodes that extend in the second direction on the bit lines, wherein the gate electrodes are spaced apart from each other in the first direction;

a gate insulation pattern on a sidewall of each of the gate electrodes;

a channel that contacts an upper surface of each of the bit lines and a sidewall of the gate insulation pattern, wherein the channel includes an amorphous oxide semiconductor material;

an oxide semiconductor pattern that contacts an upper portion of a sidewall of the channel, wherein the oxide semiconductor pattern includes a crystalline oxide semiconductor material;

a contact plug that contacts a top surface of the channel and an upper surface of the oxide semiconductor pattern; and a capacitor on the contact plug.

17. The semiconductor device according to claim 16, wherein a sidewall of the contact plug in the first direction and a sidewall of the oxide semiconductor pattern in the first direction are aligned in a vertical direction substantially perpendicular to the upper surface of the substrate.

18. The semiconductor device according to claim 16, wherein the top surface of the channel is substantially coplanar with the upper surface of the oxide semiconductor pattern.

19. The semiconductor device according to claim 16, wherein a distance of an upper surface of the gate insulation pattern from an upper surface of the substrate is greater than a distance of an upper surface of the channel from the upper surface of the substrate.

20. The semiconductor device according to claim 16, further comprising an insulation pattern between each of the gate electrodes and the contact plug, wherein the insulation pattern separates each of the gate electrodes and the contact plug from each other.

* * * * *